United States Patent
Jiang et al.

(10) Patent No.: US 11,004,726 B2
(45) Date of Patent: May 11, 2021

(54) STAIRSTEP STRUCTURES IN MULTILEVEL CIRCUITRY, AND METHOD FOR FORMING THE SAME

(71) Applicant: MACRONIX INTERNATIONAL CO., LTD., Hsinchu (TW)

(72) Inventors: Yu-Wei Jiang, Hsinchu (TW); Jia-Rong Chiou, Zhubei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 101 days.

(21) Appl. No.: 15/797,964

(22) Filed: Oct. 30, 2017

(65) Prior Publication Data
US 2019/0131170 A1 May 2, 2019

(51) Int. Cl.
*H01L 27/11556* (2017.01)
*H01L 21/768* (2006.01)
(Continued)

(52) U.S. Cl.
CPC .. *H01L 21/76802* (2013.01); *H01L 21/31144* (2013.01); *H01L 21/76879* (2013.01); *H01L 23/528* (2013.01); *H01L 23/5226* (2013.01); *H01L 27/1157* (2013.01); *H01L 27/11286* (2013.01); *H01L 27/11524* (2013.01);
(Continued)

(58) Field of Classification Search
CPC .......... H01L 27/11578; H01L 27/1157; H01L 27/11524; H01L 27/11556; H01L 27/11582; H01L 27/11575; H01L 27/157; H01L 27/11551; H01L 27/11553; H01L 27/1158; H01L 27/1286; H01L 21/76802;
(Continued)

(56) References Cited

U.S. PATENT DOCUMENTS 7,081,377 B2  7/2006 Cleeves
8,383,512 B2  2/2013 Chen et al.
(Continued)

FOREIGN PATENT DOCUMENTS

CN    103633043 A   3/2014
WO    2016126305 A1  8/2016

OTHER PUBLICATIONS

Simpson et al., "Interfacial Phase-Change Memory," Nature Nanotechnology, vol. 6, Aug. 2011, pp. 501-504.
(Continued)

*Primary Examiner* — Monica D Harrison
*Assistant Examiner* — John Lin
(74) *Attorney, Agent, or Firm* — Haynes Beffel & Wolfeld LLP

(57) ABSTRACT

A stack of sacrificial layers is formed in a set of N levels. A first etch-trim mask having spaced apart first and second open etch regions is formed over the set. Two levels are etched through using the first etch-trim mask in each of M etch-trim cycles, where M is (N−1)/2 when N is odd and (N/2)−1 when N is even. One level is etched through using the first etch-trim mask in one etch-trim cycle when N is even. The first etch-trim mask is trimmed to increase the size of the first and second open etch regions, in each of etch-trim cycles C(i) for i going from 1 to T−1, where T is (N−1)/2 when N is odd and N/2 when N is even. A second etch mask is formed over the set, covering one of the open etch regions. One level is etched through using the second etch mask.

5 Claims, 32 Drawing Sheets

(51) Int. Cl.
  *H01L 23/522* (2006.01)
  *H01L 23/528* (2006.01)
  *H01L 21/311* (2006.01)
  *H01L 27/112* (2006.01)
  *H01L 27/11582* (2017.01)
  *H01L 27/11575* (2017.01)
  *H01L 27/11548* (2017.01)
  *H01L 27/1157* (2017.01)
  *H01L 27/11524* (2017.01)
  *G11C 16/30* (2006.01)
  *G11C 16/08* (2006.01)

(52) U.S. Cl.
  CPC .. *H01L 27/11548* (2013.01); *H01L 27/11556* (2013.01); *H01L 27/11575* (2013.01); *H01L 27/11582* (2013.01); *G11C 16/08* (2013.01); *G11C 16/30* (2013.01)

(58) Field of Classification Search
  CPC ........... H01L 21/76879; H01L 23/5226; H01L 23/528
  See application file for complete search history.

(56) References Cited

U.S. PATENT DOCUMENTS

| | | | |
|---|---|---|---|
| 8,598,032 B2 | 12/2013 | Chen et al. | |
| 8,633,099 B1 | 1/2014 | Shih et al. | |
| 8,736,069 B2 | 5/2014 | Chiu et al. | |
| 8,836,137 B2 | 9/2014 | Chen | |
| 9,048,341 B2 | 6/2015 | Chen et al. | |
| 9,087,790 B2 | 7/2015 | Oh et al. | |
| 9,142,455 B2 | 9/2015 | Kim et al. | |
| 9,230,904 B2 | 1/2016 | Eun et al. | |
| 9,449,966 B2 | 9/2016 | Chen | |
| 9,472,422 B2 | 10/2016 | Hong | |
| 9,601,577 B1 | 3/2017 | Lee et al. | |
| 9,812,464 B1 * | 11/2017 | Hwang | H01L 27/11582 |
| 2014/0027838 A1 * | 1/2014 | Kido | H01L 27/0688 |
| | | | 257/329 |
| 2014/0048945 A1 | 2/2014 | Lim et al. | |
| 2014/0054787 A1 | 2/2014 | Eun et al. | |
| 2017/0179028 A1 * | 6/2017 | Lee | H01L 27/11578 |

OTHER PUBLICATIONS

Ohyanagi et al., "Special Electrical Characteristics of Superlattice Phase Change Memory," 224th ECS Meeting, the Electrochemical Society, 2013, p. 1.

Lai et al., "A Multi-Layer Stackable Thin-Film Transistor (TFT) NAND-Type Flash Memory," IEEE International Electron Devices Meeting, Dec. 11-13, 2006.

Jung et al., "Three Dimensionally Stacked NAND Flash Memory Technology Using Stacking Single Crystal Si Layers on ILD and TANOS Structure for Beyond 30nm Node," IEEE International Electron Devices Meeting, Dec. 11-13, 2006.

Johnson et al., "512-Mb PROM With a Three-Dimensional Array of Diode/Anti-fuse Memory Cells," IEEE J. of Solid-State Circuits, vol. 38, No. 11, Nov. 2003.

Kim et al., "Novel 3D Structure for Ultra-High Density Flash Memory with VRAT and PIPE," 2008 Symposium on VLSI Technology Digest of Technical Papers, Jun. 17-19, 2008, pp. 122-123.

Tanaka et al., "Bit Cost Scalable Technology with Punch and Plug Process for Ultra High Density Flash Memory," 2007 Symposium on VLSI Technology Digest of Technical Papers, Jun. 12-14, 2007, pp. 14-15.

EP 17199908—Search Report dated Apr. 24, 2018, 10 pages.

* cited by examiner

STAIRSTEP STRUCTURES IN MULTILEVEL CIRCUITRY, AND METHOD FOR FORMING THE SAME

BACKGROUND

Field of the Technology

The present technology relates generally to high density integrated circuit devices, and more particularly to methods for forming stairstep structures in multilevel three-dimensional devices.

Description of Related Art

In the manufacturing of memory devices, the amount of data per unit area on an integrated circuit can be a critical factor. Thus, as the critical dimensions of the memory devices approach lithographic technology limits, techniques for stacking multiple levels of memory cells have been proposed in order to achieve greater storage density and lower costs per bit.

For example, thin film transistor techniques are applied to charge trapping memory in Lai, et al., "A Multi-Layer Stackable Thin-Film Transistor (TFT) NAND-Type Flash Memory," IEEE Int'l Electron Devices Meeting, 11-13 Dec. 2006; and in Jung et al., "Three Dimensionally Stacked NAND Flash Memory Technology Using Stacking Single Crystal Si Layers on ILD and TANOS Structure for Beyond 30 nm Node," IEEE Int'l Electron Devices Meeting, 11-13 Dec. 2006.

Also, cross-point array techniques have been applied for anti-fuse memory in Johnson et al., "512-Mb PROM With a Three-Dimensional Array of Diode/Anti-fuse Memory Cells," IEEE J. of Solid-State Circuits, Vol. 38, No. 11, Nov. 2003. See, also U.S. Pat. No. 7,081,377 to Cleeves entitled "Three-Dimensional Memory."

Another structure that provides vertical NAND cells in a charge trapping memory technology is described in "Novel 3D Structure for Ultra-High Density Flash Memory with VRAT and PIPE," by Kim et al., 2008 Symposium on VLSI Technology Digest of Technical Papers;" 17-19 Jun. 2008; pages 122-123.

In three-dimensional (3D) stacked memory devices, conductive interconnects used to couple the lower levels of memory cells to peripheral circuits, like decoders, drivers and the like, pass through the upper layers. Stairstep structures have been formed to accommodate the interconnects, so that vertical interlevel connections can be made to landing areas on each level of the circuitry, the vertical interconnections extending to a plane over the top level of the stack for routing to the peripheral circuits by patterned conductors in metal layers.

One approach to reduce the number of lithographic steps used to make stairstep structures is described in Tanaka et al., "Bit Cost Scalable Technology with Punch and Plug Process for Ultra High Density Flash Memory," 2007 Symposium on VLSI Technology Digest of Technical Papers; 12-14 Jun. 2007; pages 14-15. Tanaka describes a mask, etch, trim sequence in FIG. 8, for example.

Other technologies are described in U.S. Pat. No. 8,598,032 issued on 3 Dec. 2013, entitled REDUCED NUMBER OF MASKS FOR IC DEVICE WITH STACKED CONTACT LEVELS; U.S. Pat. No. 8,383,512 issued on 26 Feb. 2013, entitled METHOD FOR MAKING MULTILAYER CONNECTION STRUCTURE; U.S. Pat. No. 8,836,137 issued on 16 Sep. 2014, entitled METHOD FOR CREATING A 3D STACKED MULTICHIP MODULE; U.S. Pat. No. 9,048,341 issued on 2 Jun. 2015, entitled INTEGRATED CIRCUIT CAPACITOR AND METHOD; U.S. Pat. No. 8,633,099 issued on 21 Jan. 2014, entitled METHOD FOR FORMING INTERLEVEL CONNECTORS IN A THREE-DIMENSIONAL STACKED IC DEVICE; and U.S. Pat. No. 8,736,069 issued on 27 May 2014, entitled MULTI-LEVEL VERTICAL PLUG FORMATION WITH STOP LAYERS OF INCREASING THICKNESSES, the disclosures of which are incorporated by reference.

However, drawbacks with contact structures for 3D stacked memory devices, and other 3D circuit structures, include a high number of lithographic and etch mask steps required, and a relatively large area in layout required. Both of these problems increase costs and reduce density of the circuits. These drawbacks become more and more difficult as the number of levels increases for high density circuits.

It is desirable to provide a technology that can limit the number of photolithographic masks required for contact structures including interlevel connectors, particularly for 3D devices with a large number of levels.

SUMMARY

A device is described including multilevel circuitry having circuit elements disposed in a set of levels having N members, where N is an integer greater than 2. The device includes first and second openings on the set overlying first and second stairstep structures respectively. One of the first and second stairstep structures can include a first stairstep structure configuration and another of the first and second stairstep structures can include a second stairstep structure configuration different than the first stairstep structure configuration. The first stairstep structure configuration can include landing areas on levels L(i×2) for i going from 1 to M1, where M1 is (N−1)/2 when N is odd and M1 is N/2 when N is even, and another landing area on a level L(N) when N is odd. The second stairstep structure configuration can include landing areas on levels L(i×2+1) for i going from 0 to M2, where M2 is (N−1)/2 when N is odd and M2 is N/2−1 when N is even, and another landing area on a level L(N) when N is even.

The device can include a third opening on the set overlying a third stairstep structure. The second opening can be disposed between the first and third openings. In one embodiment, the first and third stairstep structures can include the first stairstep structure configuration, and the second stairstep structure can include the second stairstep structure configuration. In an alternative embodiment, the first and third stairstep structures can include the second stairstep structure configuration, and the second stairstep structure can include the first stairstep structure configuration. The second opening on the set can overlie a fourth stairstep structure opposite and in mirror image of the second stairstep structure.

The circuit elements disposed in the set of circuit levels can comprise conductors in a layer of conductive material and a layer of insulating material. The device can further comprise a dielectric fill over the landing areas, contact openings down to the landing areas through the dielectric fill, and interlevel connectors in the contact openings.

A method of forming the device includes forming a stack of sacrificial layers separated by dielectric layers in a set of levels including N members, where N is an integer greater than 2, and forming a first etch-trim mask over the set, where the first etch-trim mask has spaced apart first and second open etch regions.

Portions of the sacrificial layers and dielectric layers in the set are removed to form landing areas on the levels in the set using a first etch-trim mask and a second etch mask. The clauses "first etch-trim mask" and "second etch mask" are used as labels herein, and do not imply structure or any order in using the two different masks. For example, a "first etch-trim mask" and a "second etch mask" can be implemented using the same type of mask material, such as photoresist, or can be implemented using different types of mask material. For example, a "first etch-trim mask" can be formed before a "second etch mask," and vice versa.

Two levels in the set can be etched through using the first etch-trim mask in each of M etch-trim cycles, where M is (N−1)/2 when N is odd and M is (N/2)−1 when N is even. One level in the set can be etched through using the first etch-trim mask in one etch-trim cycle when N is even.

The first etch-trim mask can be trimmed to increase the size of the first and second open etch regions, in each of etch-trim cycles C(i) for i going from 1 to T−1, where T is (N−1)/2 when N is odd and T is N/2 when N is even. Here "etch-trim cycles C(i) for i going from 1 to T−1" include the "M etch-trim cycles" and the "one etch-trim cycle" when N is even, except the last cycle in a sequence of etch-trim cycles including the "M etch-trim cycles" and the "one etch-trim cycle."

In one embodiment, the step to etch through two levels in the set using the first etch-trim mask in each of M etch-trim cycles can be executed before the step to etch through one level in the set using the first etch-trim mask in one etch-trim cycle. In this embodiment, the last cycle is the "one etch-trim cycle" in which the first etch-trim mask is not trimmed. In an alternative embodiment, the step to etch through one level in the set using the first etch-trim mask in one etch-trim cycle can be executed before the step to etch through two levels in the set using the first etch-trim mask in each of M etch-trim cycles. In this embodiment, the last cycle in the sequence is the last cycle of the "M etch-trim cycles" in which the first etch-trim mask is not trimmed.

A second etch mask can be formed over the set, the second etch mask covering one of the increased size first and second open etch regions, and exposing another of the increased size first and second open etch regions. One level in the set can be etched through using the second etch mask.

In one embodiment, the step to form the first etch-trim mask, the step to etch through two levels, and the step to etch through one level in the set using the first etch-trim mask, and the step to trim the first etch-trim mask can be executed before the step to form the second etch mask. In an alternative embodiment, the step to form the second etch mask and the step to etch through one level in the set using the second etch mask can be executed before the step to form the first etch-trim mask.

The first etch-trim mask can have a third open etch region spaced apart from the first and second open etch regions. The second open etch region can be disposed between the first open etch region and the third open etch region. In one embodiment, the second etch mask can cover the increased size second open etch region and expose the increased size first and third open etch regions. In an alternative embodiment, the second etch mask can cover the increased size first and third open etch regions and expose the increased size second open etch region.

The levels in the set of levels can comprise a layer of conductive material and a layer of insulating material. After landing areas are formed on the levels in the set of levels, a dielectric fill can be applied over the landing areas. Contact openings can be created down to the landing areas through the dielectric fill, and interlevel connectors can be formed in the contact openings.

Other aspects and advantages of the present technology can be seen on review of the figures, the detailed description and the claims, which follow.

DETAILED DESCRIPTION

Figure 1:
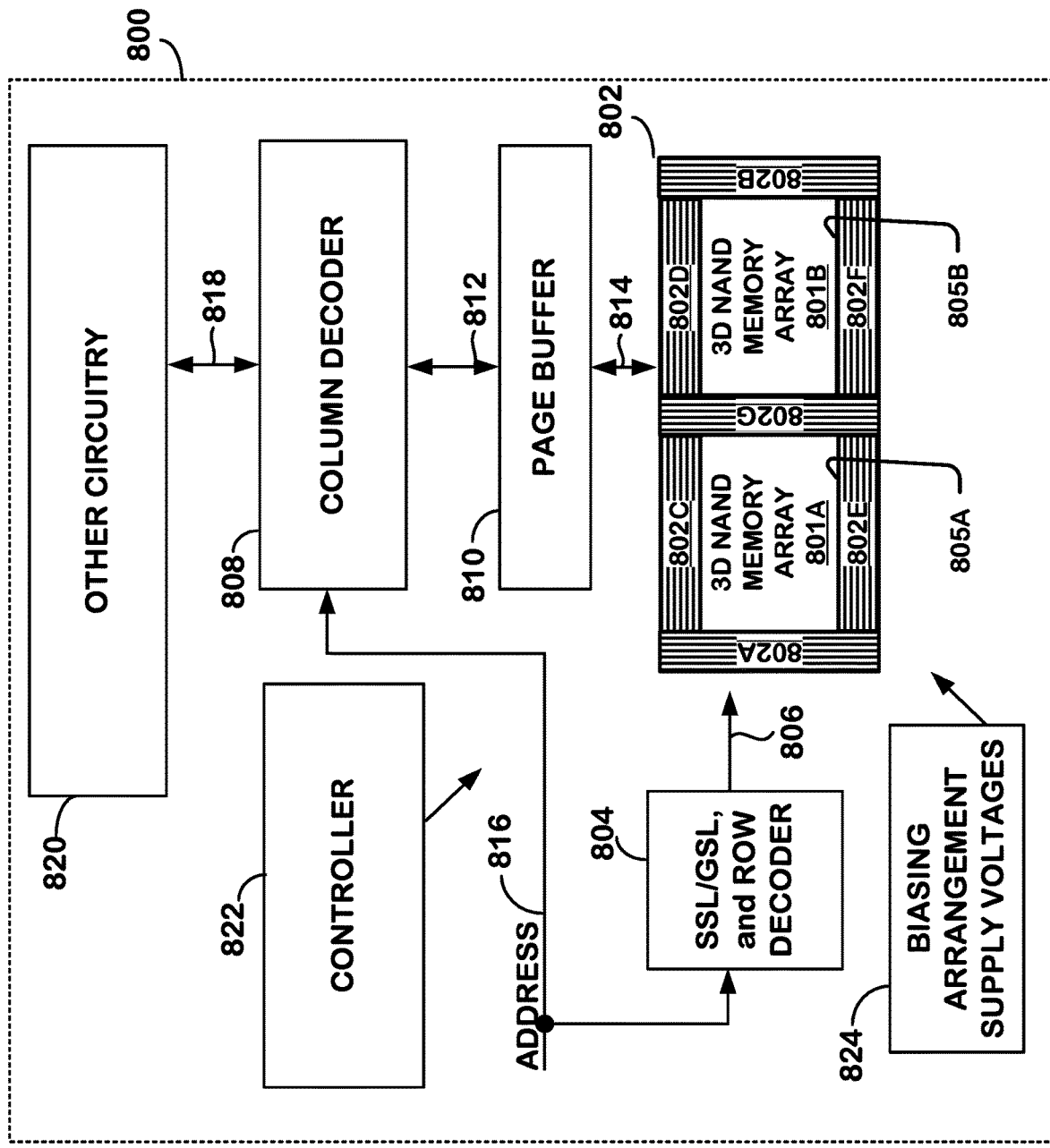
FIG. 1 is a block diagram of an integrated circuit including stairstep contact structures in contact regions on the perimeter of an array area.

The following description of embodiments of the present technology will typically be with reference to specific structural embodiments and methods. It is to be understood that there is no intention to limit the technology to the specifically disclosed embodiments and methods but that the technology may be practiced using other features, elements, methods and embodiments. Preferred embodiments are described to illustrate the present technology, not to limit its scope, which is defined by the claims. Those of ordinary skill in the art will recognize a variety of equivalent variations on the description that follows. Like elements in various embodiments are commonly referred to with like reference numerals.

FIG. 1 is a block diagram of an integrated circuit 800 including a 3D NAND memory array 802 having stepped connectors, such as stepped interlevel connectors 64 (FIG. 6) as described herein, to the bit lines or word lines, or both. A 3D NAND memory array 802 can include multiple levels of cells arranged in multiple NAND strings. A decoder 804 is coupled to a plurality of word lines 806 arranged along rows in the 3D NAND memory array 802 and to the SSL and GSL lines for selecting cells and NAND strings in the array. Decoder 808 is coupled to a set of page buffers 810, in this example via data bus 812. The global bit lines 814 are coupled to local bit lines in the 3D NAND memory array 802. Addresses are supplied on bus 816 to decoder 808 and decoder 804. Data is supplied via the data-in line 818 from other circuitry 820 (including for example input/output ports) on the integrated circuit, such as a general purpose processor or special purpose application circuitry, or a combination of modules providing system-on-a-chip functionality supported by the 3D NAND memory array 802. Data is supplied via the data-in line 818 to input/output ports or to other data destinations internal or external to the integrated circuit 800.

A controller 822, implemented for example as a state machine, provides signals to control the various components of integrated circuit 800. Using a bias arrangement state machine, the controller controls the application of supply voltages generated or provided through the voltage supply or supplies in block 824, such as read, erase, verify and program bias voltages. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

The integrated circuit 800 includes a 3D NAND memory array in multilevel regions 801A and 801B and interlevel contact structures in contact regions 802A through 802G, which are one example of multilevel circuitry having circuit elements disposed in a set of circuit levels including a number N members. The multilevel circuitry has multilevel regions, which can be referred to as the array regions, having a rectangular perimeter 805A for the multilevel region 801A in this example with four sides, and a rectangular perimeter 805B for the multilevel region 801B in this example with four sides. The contact regions 802A, 802C, 802E and 802G are disposed around the perimeter 805A of the multilevel region 801A. The contact regions 802B, 802D, 802F and 802G are disposed around the perimeter 805B of the multilevel region 801B. The contact region 802G is disposed between multilevel regions 801A and 801B. In one embodiment, contact regions 802A and 802B overlie first and third stairstep structures (e.g. 971 and 973, FIG. 15; 1271 and 1273, FIG. 18), and contact region 802G overlies the second and fourth stairstep structures (e.g. 972 and 974, FIG. 15; 1272 and 1274, FIG. 18). In a compact arrangement, the contact regions have sides co-located on the sides of the perimeter.

The perimeters 805A and 805B overlie transition regions between circuit elements in the multilevel regions and the interlevel contact structures in the contact regions 802A through 802G. The locations of the perimeters can be defined by the masks used in formation of the contact regions, and overlie the transition regions in the multilevel circuitry. The circuit elements within the transition regions comprise horizontal conductors which connect to the active multilevel circuitry, in this example circuit elements such as word lines, bit lines, source lines and the like in the memory arrays, to the interlevel connectors in the contact regions. In some examples, the horizontal conductors are patterned lines which can have very high density, or broader conductor structures which may be plate-shaped for example.

As described in more detail below, an interlevel contact structure can include first and second openings on the set overlying first and second stairstep structures respectively. One of the first and second stairstep structures can include a first stairstep structure configuration and another of the first and second stairstep structures can include a second stairstep structure configuration different than the first stairstep structure configuration. The first stairstep structure configuration can include landing areas on levels L(i×2) for i going from 1 to M1, where M1 is (N−1)/2 when N is odd and M1 is N/2 when N is even, and another landing area on a level L(N) when N is odd. The second stairstep structure configuration can include landing areas on levels L(i×2+1) for i going from 0 to M2, where M2 is (N−1)/2 when N is odd and M2 is N/2-1 when N is even, and another landing area on a level L(N) when N is even.

Other integrated circuits can include 3D circuitry other than memory circuits, with which the contact structures described herein can be deployed.

Figure 2:
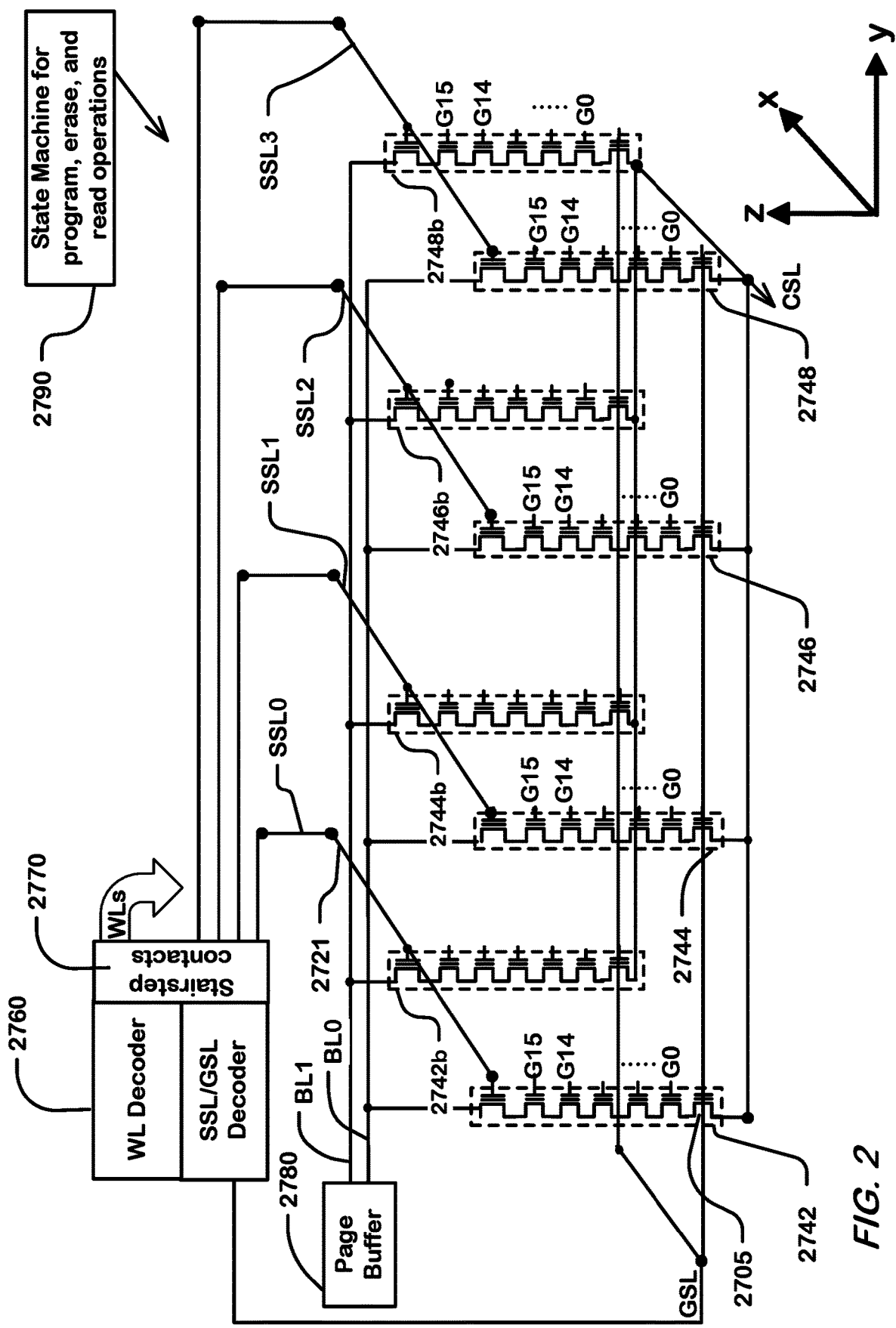
FIG. 2 illustrates a 3D memory structure with multiple levels in a schematic format which can be coupled with the stairstep contact structures as described herein.

FIG. 2 is a circuit diagram illustrating a multilevel circuit structure used to implement a 3D array suitable for use in the device described with reference to FIG. 1. NAND strings of memory cells shown in FIG. 2 are representative of a plurality of NAND strings of memory cells in the memory device. Two NAND strings of memory cells (e.g. 2742 and 2742b, 2744 and 2744b, 2746 and 2746b, 2748 and 2748b) are shown for each stack, which are representative of multiple NAND strings in a stack. NAND strings are connected to respective bit lines (e.g. BL0, BL1) at upper ends of the stacks.

As shown in the example of FIG. 2, a first NAND string 2742 includes circuit elements disposed in multiple levels, including an upper SSL strip 2721 configured as a string select line SSL0 in an upper level, intermediate strips configured as word lines (e.g. G15, G14, . . . G0) in intermediate levels, and a bottom strip 2705 configured as a ground select line GSL in lower levels, disposed below the intermediate strips. In some embodiments, dummy word lines can be implemented on separate levels of the stack. In this example, there are only 16 word line levels with an SSL level and a GSL level for a total of 16 levels of circuit elements. In other implementations, there can be many more levels, such as 39 levels or 60 levels as used in examples described below, and other amounts as required according to a particular implementation.

As shown in the example of FIG. 2, a common source line CSL is disposed beneath the multilevel structure. The bottom GSL strip 2705 controls a GSL switch at the bottom of each string for connection to the common source line CSL. Bit lines, BL0 and BL1 in this illustrated example, are coupled to the strings at the top of each string of cells. The upper SSL strip 2721 controls an SSL switch at the top of each string.

Some peripheral circuits are shown in FIG. 2. The multilevel circuit elements in the array are coupled to the peripheral circuits, which may be implemented in a single layer circuit, or a multilevel circuit located outside the multilevel region in which the array is implemented. In this example, the peripheral circuits include a page buffer 2780 which is coupled to the bit lines BL0, BL1. Also, the peripheral circuits include a word line and SSL/GSL decoder 2760 coupled to stairstep contacts 2770 which in turn connect to the strips configured as word lines, the SSL lines, and the GSL line in the multilevel circuit structure using technology as described herein. The peripheral circuits also include a state machine 2790 for example, used to control program, erase and read operations in the multilevel circuit.

Thus, referring to FIG. 2, circuit elements of the multilevel structure coupled to the word lines, for example, extend into a contact region on the perimeter of the multilevel region of the device. Stairstep structures are used for connecting the circuit elements in the contact region to overlying patterned connectors which connect to the peripheral circuits.

As mentioned above, the multilevel structure in a given integrated circuit can include a variety of different types of memory structures, logic structures, or other circuitry elements. Stairstep structures for making contact between the multilevel structure and other circuit features can be implemented as described herein.

FIGS. 3A-3D are simplified drawings used to describe basic steps used in an etch-trim cycle as can be used in examples of the technology described herein. The figures show a multilevel circuit structure on an integrated circuit including a stack 10 of sacrificial layers (e.g. 12.1, 12.2, 12.3 and 12.4) interleaved with dielectric layers (e.g. 14.1, 14.2, 14.3 and 14.4). For brevity, the sacrificial layers (e.g. 12.1, 12.2, 12.3 and 12.4) can be collectively referred to as sacrificial layers 12, and the dielectric layers (e.g. 14.1, 14.2, 14.3 and 14.4) can be collectively referred to as dielectric layers 14. The sacrificial layers can include materials such as SiN and SiO. At a later stage of the process, such as after the process steps illustrated in FIGS. 15, 18, 28 and 31, the sacrificial layers (e.g. SiN, SiO) can be replaced with conductive layers, to form a set of circuit levels where each level in the set of circuit levels can include a layer of conductive material and a layer of insulating material. In this example, the specific sacrificial layers and dielectric layers are identified as sacrificial layers 12.1, 12.2, 12.3, and 12.4 and as dielectric layers 14.1, 14.2, 14.3 and 14.4. In this example, each level includes a sacrificial layer (e.g. 12.2) and a dielectric layer (e.g. 14.2) that underlies the sacrificial layer. In alternative embodiments, each level includes a dielectric layer and a sacrificial layer that underlies the dielectric layer. In such alternatives, the etching chemistry is chosen to stop on the dielectric layer in each level, rather than on the sacrificial layer.

Figure 3:
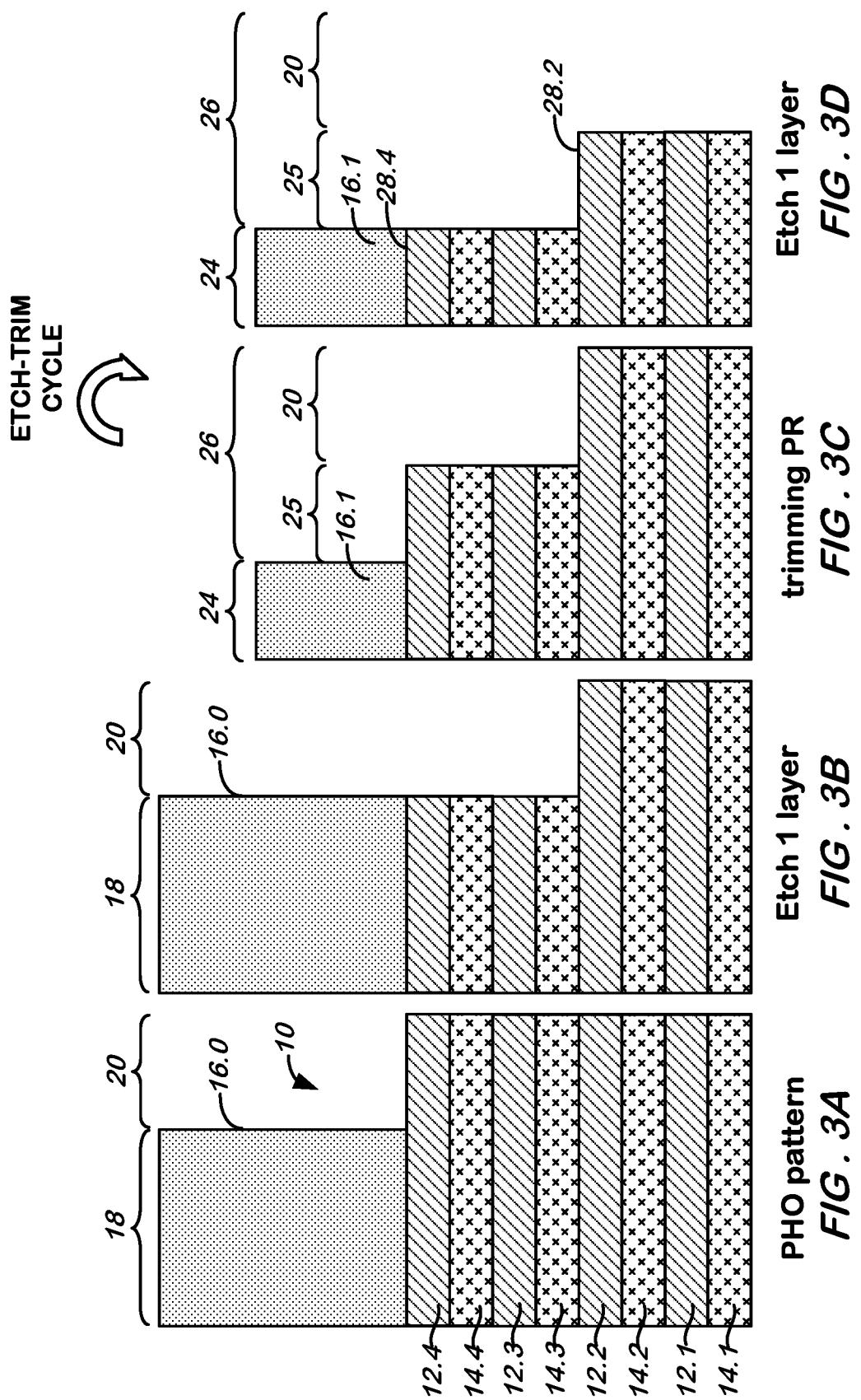
FIGS. 3A, 3B, 3C and 3D are a set of simplified drawings illustrating an "etch-trim cycle," in which a stack of sacrificial layers are separated by dielectric layers, where the "etch-trim cycle" etches two levels, trims the etch mask, and etches two more levels to create the structure of FIG. 3D.

The etching of stack 10 of sacrificial layers 12 and dielectric layers 14 exposes landing areas 28.2 and 28.4 using an etch-trim mask. FIG. 3A shows a first etch-trim mask 16.0 including a mask region 18 and an open etch region 20. Using the first etch-trim mask 16.0, two levels can be etched. FIG. 3B shows the result of etching two levels through top two sacrificial layers 12.4 and 12.3 and dielectric layers 14.4 and 14.3 at the open etch region 20 stopping at second sacrificial layer 12.2. FIG. 3C shows the result of trimming the first etch-trim mask 16.0 of FIG. 3B creating a trimmed first etch-trim mask 16.1 having a trimmed mask region 24, a new open etch region 25, and an expanded open etch region 26, region 26 being equal to region 20 plus region 25. FIG. 3D shows the result of etching two levels of the structure of FIG. 3C at expanded open etch region 26. The resulting structure has exposed sacrificial landing areas (e.g. 28.2, 28.4). Area 28.4 is considered exposed because it will be exposed upon removal of the trimmed etch mask having the trimmed mask region 24.

Figure 4:
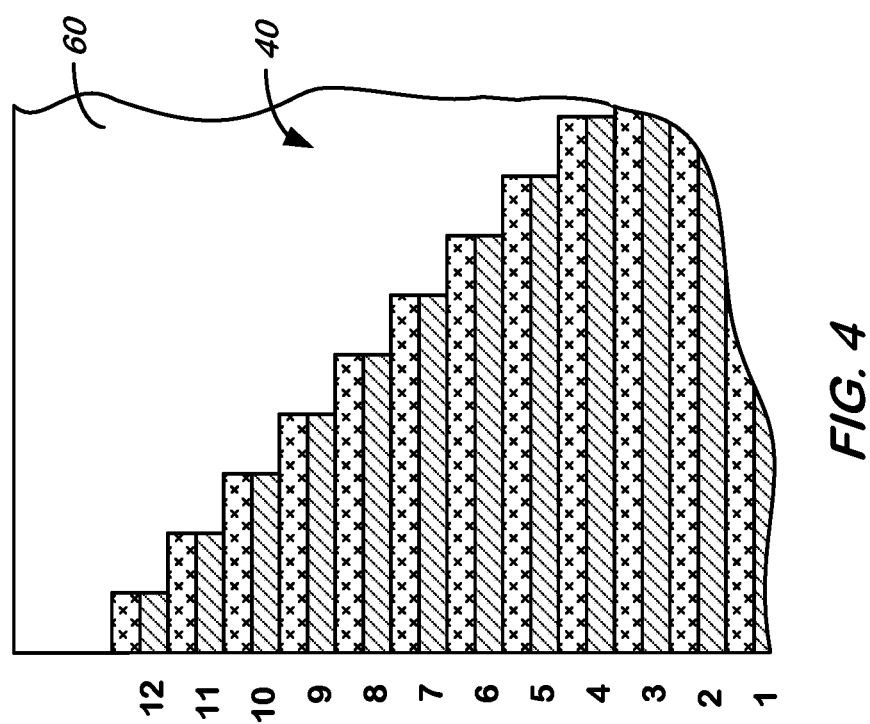
FIG. 4 illustrates dielectric material covering the landing areas of a portion of a processed stack.
Figure 5:
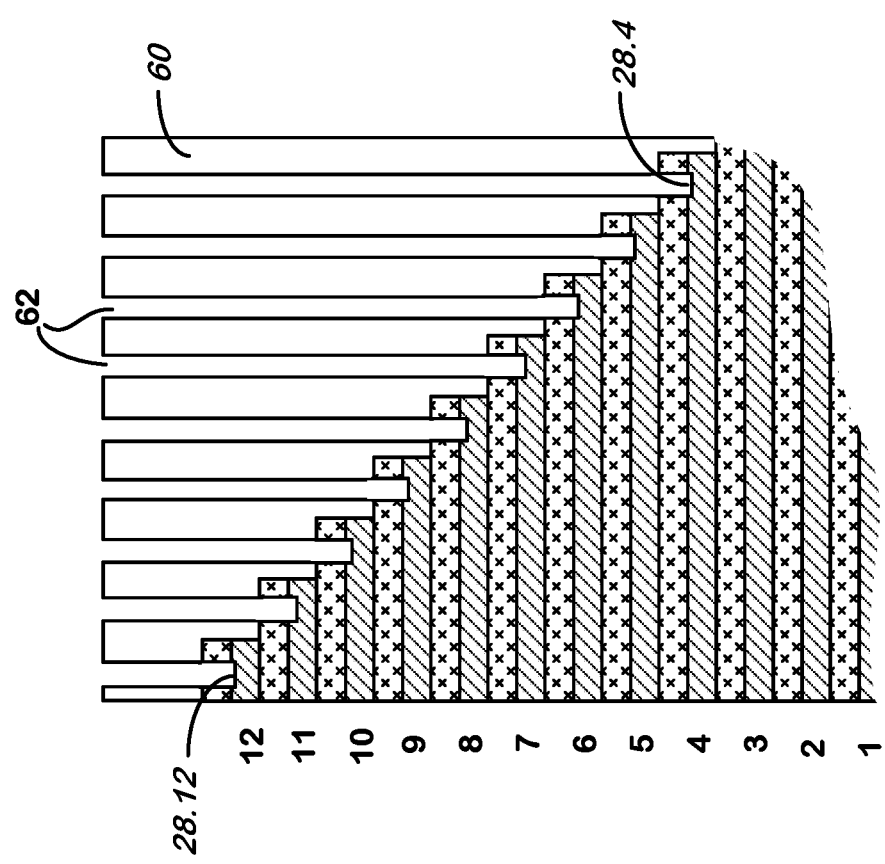
FIG. 5 shows the structure of FIG. 4 with contact openings formed through the dielectric material down to the landing areas.
Figure 6:
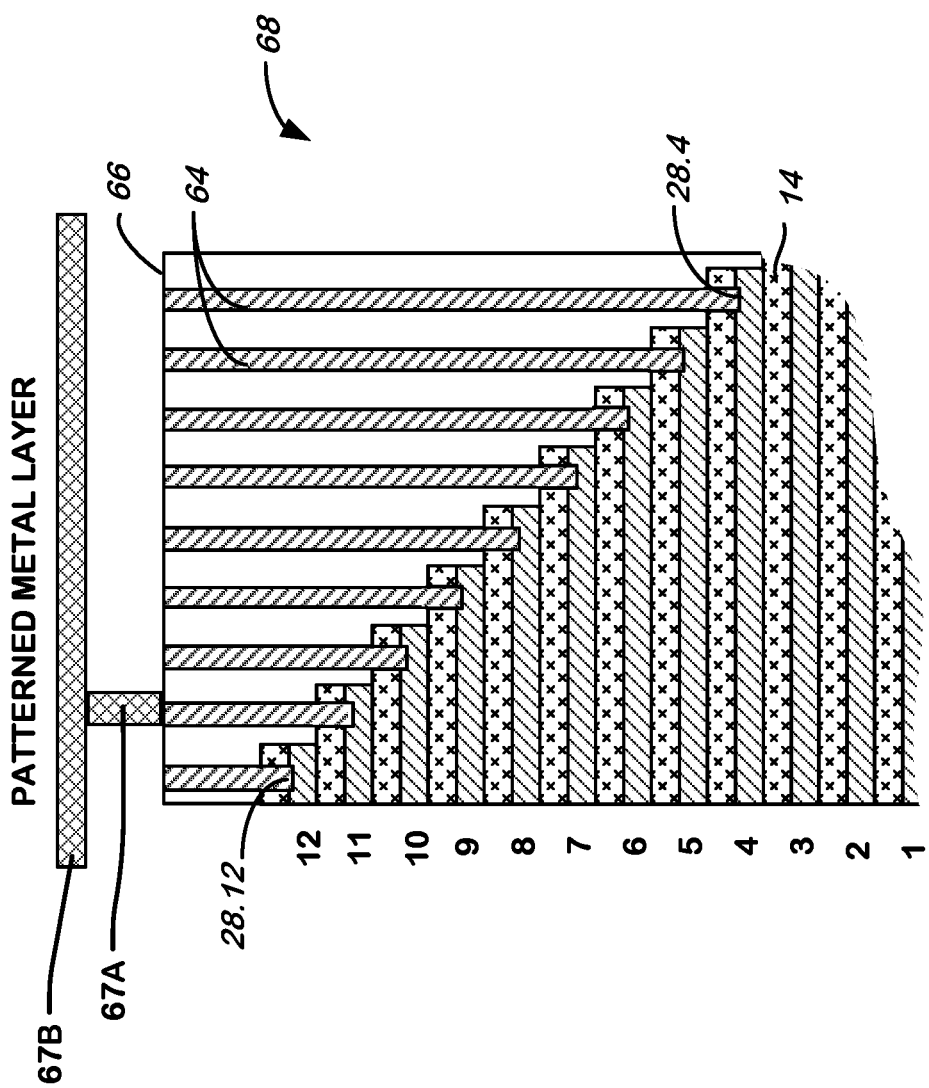
FIG. 6 illustrates the structure of FIG. 5 after the contact openings have been filled with an electrically conductive material forming interlevel connectors contacting the landing areas.

One technique for forming interlevel connectors, which contact the landing areas on the steps of the stairstep structures can be understood with reference to FIGS. 4-6. In FIGS. 4-6, each level has a dielectric layer on top of a sacrificial layer. After applying the etching processes to form the stairstep structures, the landing areas of the stairstep stack can be covered by a dielectric fill material 60 such as common silicon oxide based materials. FIG. 4 illustrates a portion of a processed stack 40 with a dielectric material 60 covering landing areas 28.2 and 28.4 (FIG. 3A-3D) on the sacrificial layer in the levels. Dielectric fill material 60 may be the same material as dielectric layers 14 (FIG. 3A-3D) or a different material. FIG. 5 shows contact openings 62, which can be formed by a patterned contact hole etching process, to extend down to landing areas (e.g. 28.4 and 28.12). As shown in FIG. 6, the contact openings 62 are then filled with a sacrificial material extending to contact landing areas (e.g. 28.4 and 28.12), to create interlevel connectors 64. A planarizing process, such as chemical mechanical polishing, can be used to create the planarized surface 66 of the three-dimensional stairstep structure 68 shown in FIG. 6. The resulting contact surfaces at the surface 66 are used for connection to patterned conductors (e.g. 67A, 67B) above the contact regions by which connection to the peripheral circuits is made. Further information on similar techniques and methods for creating contact openings 62 are disclosed in U.S. Pat. Nos. 8,598,032, 8,383,512, 8,836,137 and 9,048,341, referenced above.

After the etch-trim process as described herein has been performed to form the levels in the set of levels where each level includes a layer of sacrificial material (e.g. SiN, SiO) and a layer of insulating material, further process steps can be taken to replace the sacrificial material in the set of levels with a conductive material, so that each level in the set of levels includes a layer of conductive material and a layer of insulating material. The replacement of the sacrificial material with the conductive material can result in a set of circuit levels having conductive layers interleaved with dielectric layers.

The conductive material in the set of circuit levels can be electrically conductive semiconductors including heavily doped polysilicon (using dopants such as As, P, B), silicides including TiSi, CoSi, oxide semiconductors, including InZnO, InGaZnO, and combinations of semiconductors and silicides. Conductive layers can also be a metal, a conductive compound, or combinations of materials including Al, Cu, W, Ti, Co, Ni, TiN, TaN, TaAlN, and others. Interlevel connectors 64 can be a metal or other electrically conductive materials appropriate for use with the materials used for conductive layers. Dielectric layers 14 and dielectric fill material 60 can be an oxide, nitride, oxynitride, silicate, or others as appropriate for the manufacturing techniques applied. Low dielectric constant materials having a dielectric constant smaller than that of silicon dioxide, such as $SiCHO_x$, may be preferred. High dielectric constant (high-k) materials having a dielectric constant greater than that of silicon dioxide, such as $HfO_x$, HfON, $AlO_x$, $RuO_x$, $TiO_x$, may be included also.

The present technology can be used with a wide range of integrated circuit devices including, for example, 3D NAND Flash memory. Also, embodiments can be used for devices in which the levels are chips in stacks of chips, using through silicon via (TSV) structure as the interlevel conductors, with conductive layers being separate integrated circuits with landing areas on parts of the conductive layers. Conductive layers can be word lines or bit line connectors on different layers of a 3D array of a 3D memory structure. Conductive layers can be connectors among layers of conductors on an IC package. Conductive layers can be connectors among ICs in a multi-chip module type IC package.

FIGS. 7-15 illustrate one example of process steps used in forming stairstep structures on a set of N levels, where N is an odd integer.

Figure 7:
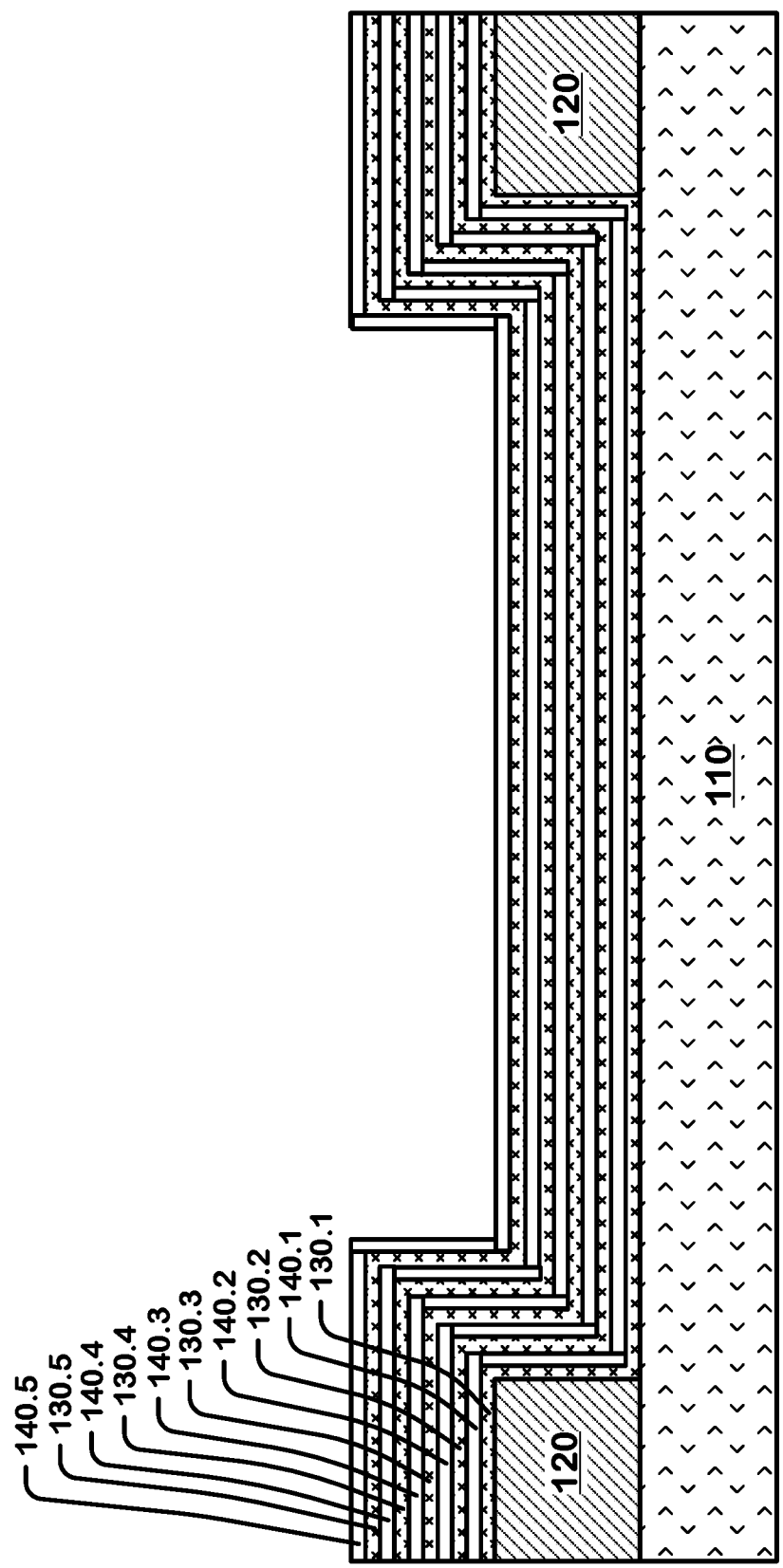
FIGS. 7-15 illustrate one example of process steps used in forming stairstep structures on a set of N levels, where N is an odd integer.

FIG. 7 is a simplified cross-sectional view of a portion of an IC device structure, showing the result of forming a set of N levels. Each level can include a sacrificial layer (e.g. 130.1-130.5) and a dielectric layer (e.g. 140.1-140.5). In this example, N is 5. In this example, the set of levels is disposed in a recess between dielectric material (e.g. 120) on a substrate (e.g. 110). A sacrificial layer can include a sacrificial material such as SiN or SiO.

As described in reference to FIGS. 8-15, portions of the levels in the set can be removed to form landing areas on the levels in the set using a first etch-trim mask in M etch-trim cycles and a second etch mask, where M is (N−1)/2 when N is odd and M is N/2−1 when N is even.

Figure 8:
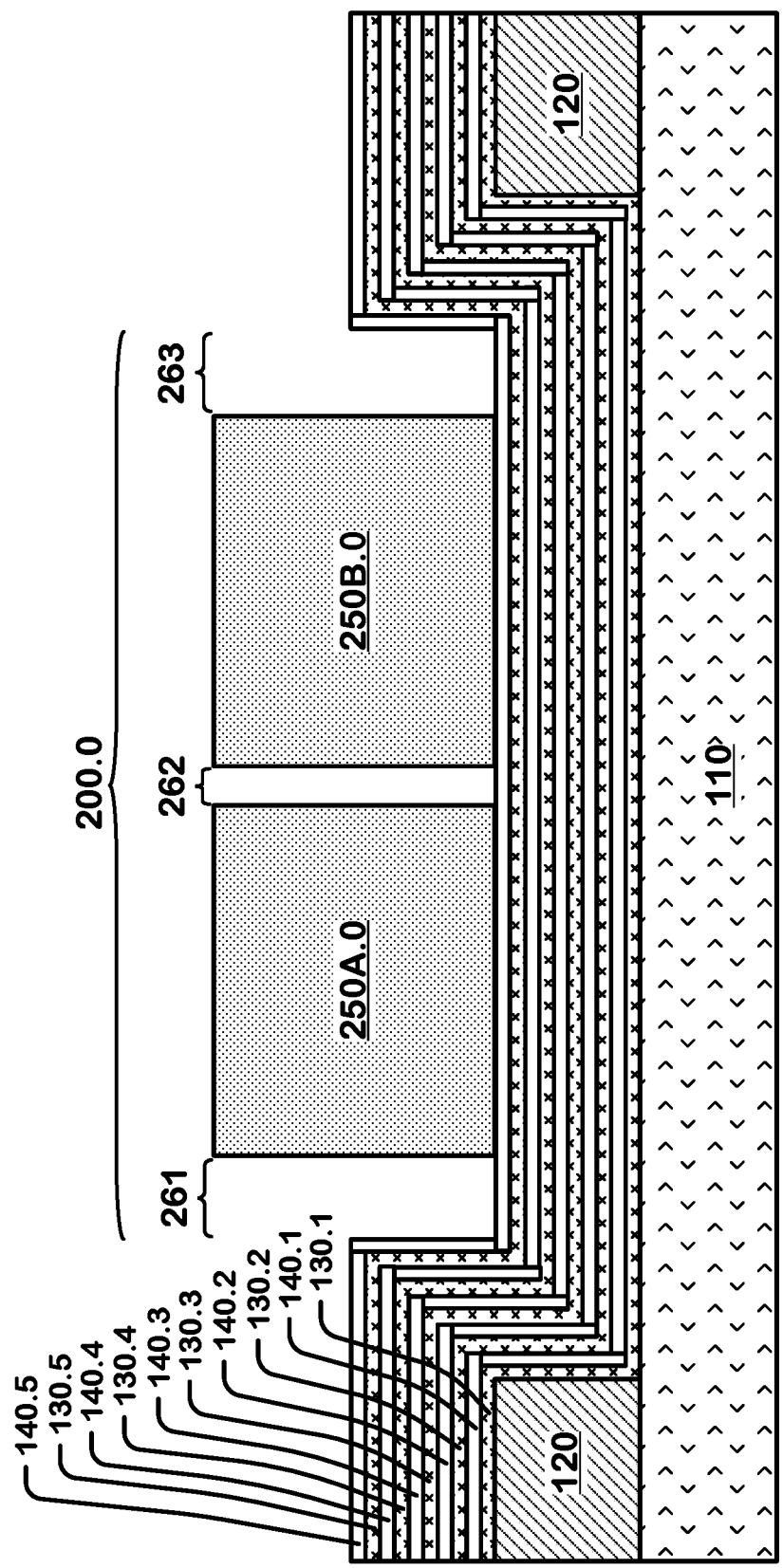

FIG. 8 is a simplified cross-sectional view of a portion of an IC device structure, showing the result of forming a first etch-trim mask 200.0 having mask regions (e.g. 250A.0, 250B.0) and spaced apart first, second and third open etch regions (e.g. 261, 262, 263). The first etch-trim mask 200.0 is disposed over a set of levels including sacrificial layers (e.g. 130.1-130.5) interleaved with dielectric layers (e.g. 140.1-140.5). The mask material used in the first etch-trim mask can be photoresist material or different types of mask material.

Figure 9:
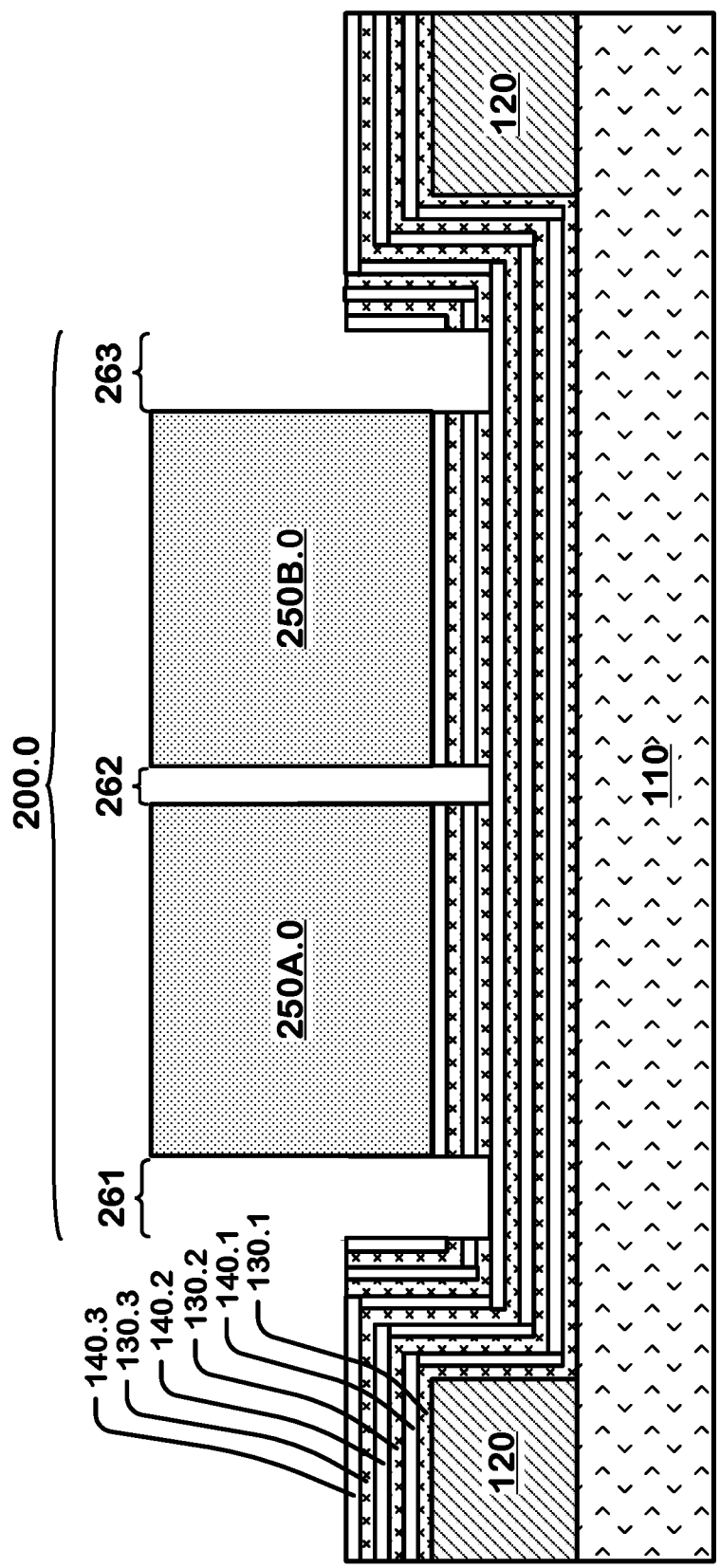

FIG. 9 is a simplified cross-sectional view of the structure, showing the result of etching through two levels in the set of N levels using the first etch-trim mask 200.0, stopping at third dielectric layer 140.3 in a third level in the set of N levels. The two levels etched through at this process step include sacrificial layers (e.g. 130.4-130.5) and dielectric layers (e.g. 140.4-140.5). In particular, the two levels in the spaced apart first, second and third open etch regions (e.g. 261, 262, 263, respectively) are etched through at this process step.

Two levels in the set can be etched through using the first etch-trim mask in each of M etch-trim cycles, where M is (N−1)/2 when N is odd and M is (N/2)−1 when N is even. In this example, N is 5, so M=(5−1)/2=2, and two levels can be etched through in each of two etch-trim cycles.

Figure 10:
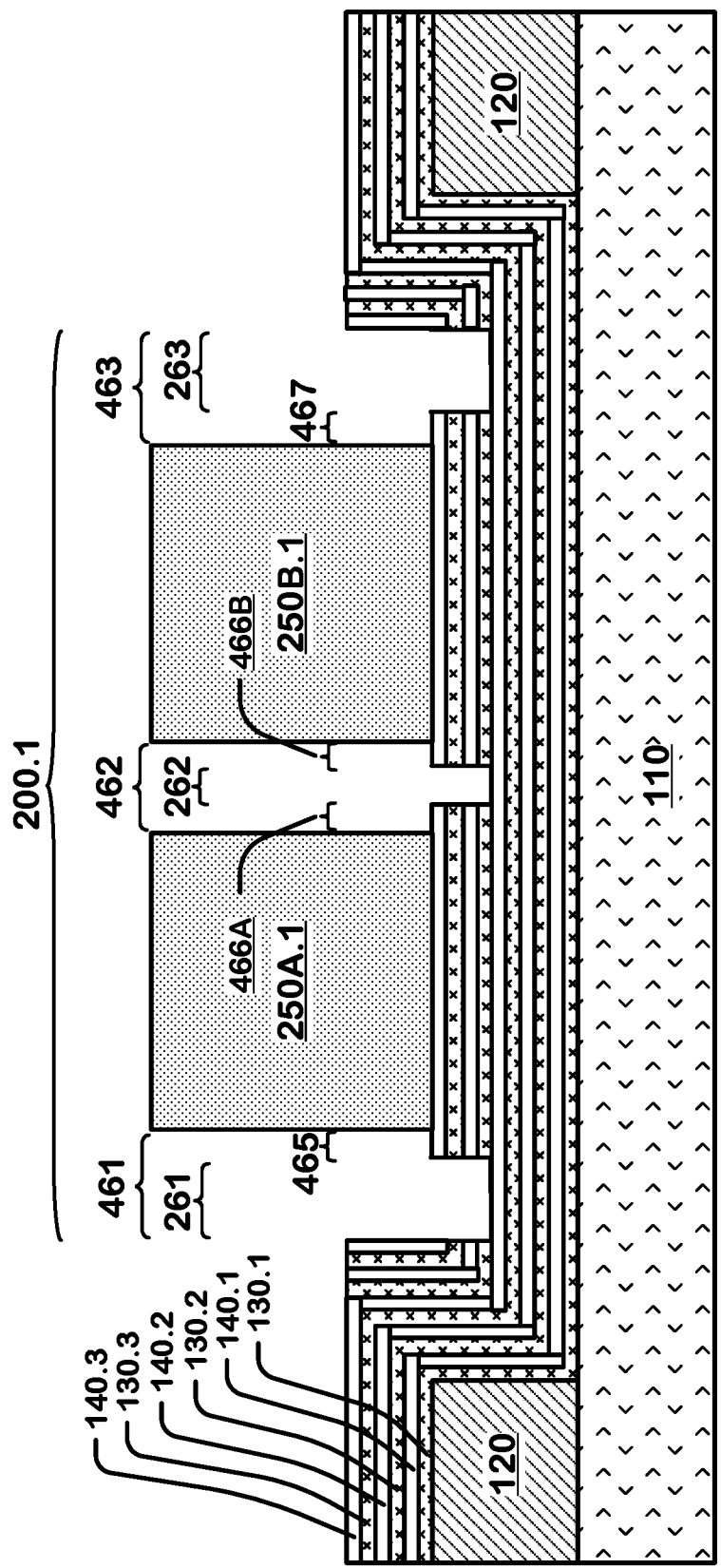

FIG. 10 is a simplified cross-sectional view of the structure, showing the result of trimming the first etch-trim mask (e.g. 200.0, FIG. 9) to increase the size of the first, second and third open etch regions. The trimming step results in the increased size first, second and third open etch regions (e.g. 461, 462, 463, respectively). In particular, the trimming step creates a trimmed first etch-trim mask 200.1 having trimmed mask regions (e.g. 250A.1, 250B.1), a new open etch region 465, an increased size first open etch region 461 being equal to region 261 plus region 465, a new open etch region 467, and an increased size third open etch region 463 being equal to region 263 plus region 467. The trimmed first etch-trim mask (e.g. 200.1) also has new open etch regions 466A and 466B, and an increased size second open etch region 462 being equal to region 262 plus regions 466A and 466B.

The step to trim the first etch-trim mask can be executed in each of etch-trim cycles C(i) for i going from 1 to T−1, where T is (N−1)/2 when N is odd and T is N/2 when N is even. In this example, N is 5, so T−1=(5−1)/2−1=1, and the step to trim the first etch-trim mask can be executed one time.

Figure 11:
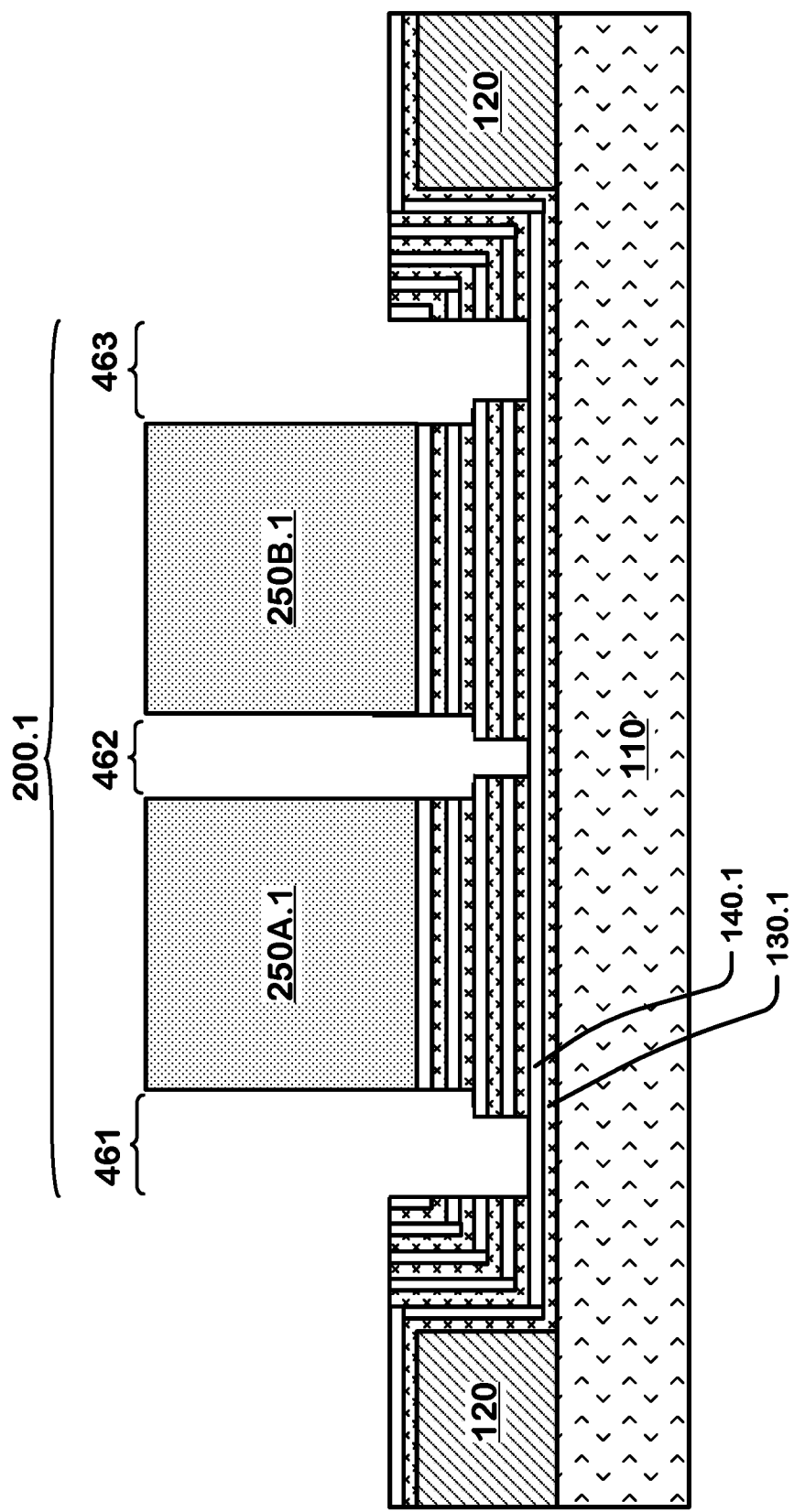

FIG. 11 is a simplified cross-sectional view of the structure, showing the result of etching through two levels in the set of N levels using the trimmed first etch-trim mask (e.g. 200.1), stopping at first dielectric layer 140.1 in a first level in the set of N levels. The two levels etched through at this process step include sacrificial layers (e.g. 130.2-130.3) and dielectric layers (e.g. 140.2-140.3). In particular, the two levels in the increased size first, second and third open etch regions (e.g. 461, 462, 463, respectively) are etched through at this process step.

As explained above, when N is 5, two levels in the set of N levels can be etched through in each of two etch-trim cycles. While FIG. 9 shows the result of etching through two levels in one of the two etch-trim cycles, FIG. 11 shows the result of etching through two levels in another of the two etch-trim cycles. In this example, when N is an odd integer, after etching through two levels in the set of N levels using the first etch-trim mask in each of M etch-trim cycles, the first etch-trim mask is not trimmed again.

Figure 12:
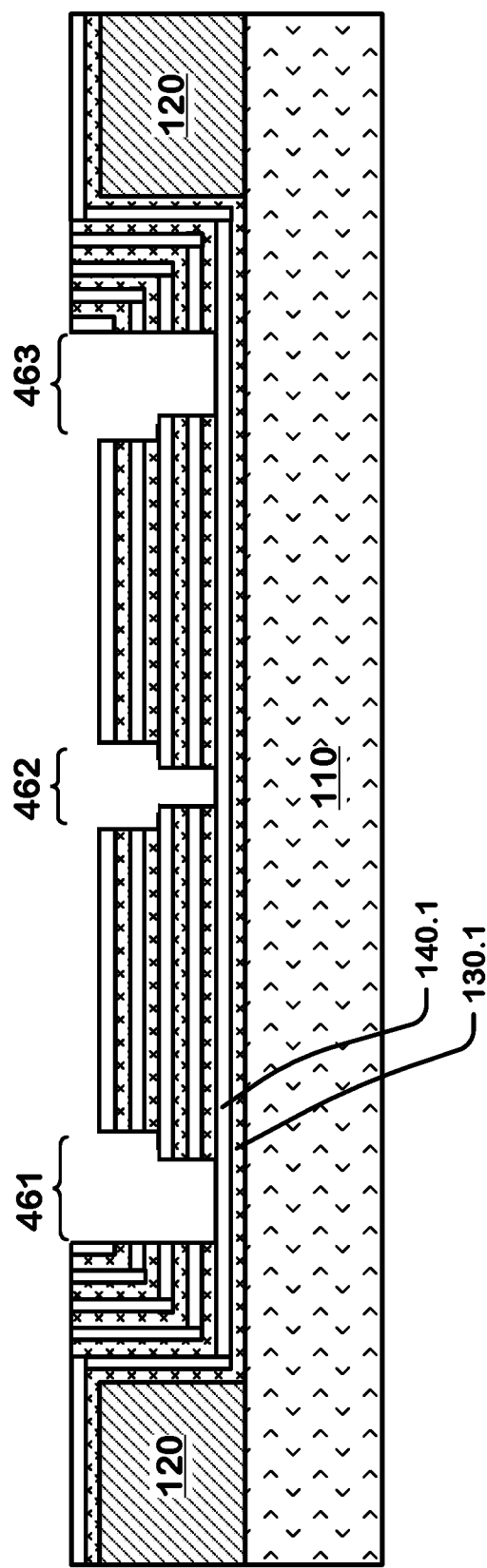

FIG. 12 is a simplified cross-sectional view of the structure, showing the result of removing the first etch-trim mask. At this process step, one level in the set of levels remains to be etched, including a sacrificial layer (e.g. 130.1) and a dielectric layer (e.g. 140.1).

Figure 13:
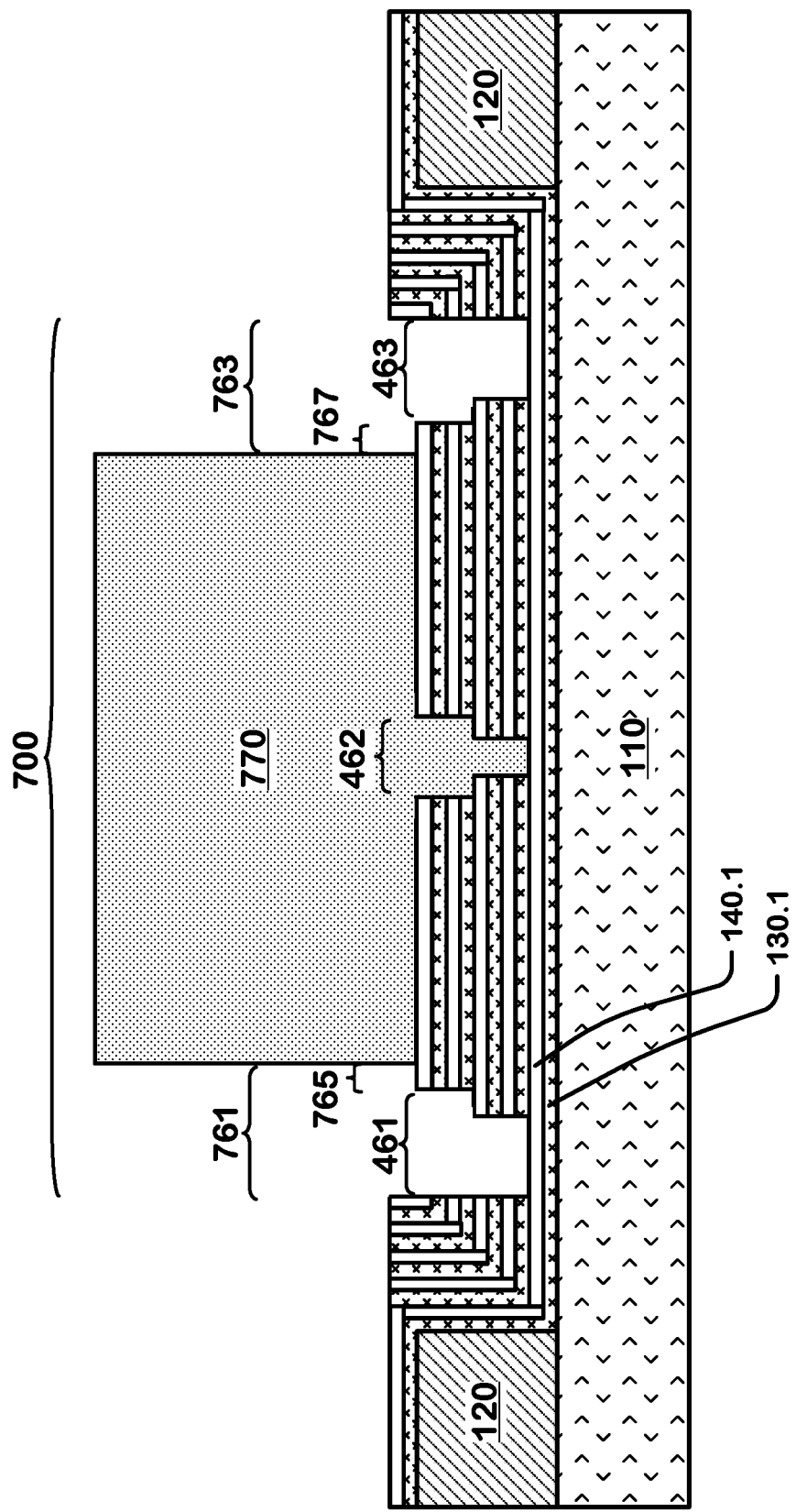

FIG. 13 is a simplified cross-sectional view of the structure, showing the result of forming a second etch mask 700 having a mask region (e.g. 770) over the set of N levels, after the first etch-trim mask is removed as shown in FIG. 12. The second etch mask can cover at least one of the increased size first, second and third open etch regions, and expose others of the increased size first, second and third open etch regions. In this example, the second etch mask 700 has a new open etch region 765, an increased size first open etch region 761 being equal to region 461 plus region 765, a new open etch region 767, and an increased size third open etch region 763 being equal to region 463 plus region 767. The size of the increased second open etch region (e.g. 462, FIG. 13) remains unchanged from the size of the second open etch region (e.g. 462, FIG. 12) before the second etch mask is formed.

In the example shown in FIG. 13, the second open etch region (e.g. 462) can be disposed between the increased size first open etch region (e.g. 761) and the increased size third open etch region (e.g. 763). The second etch mask can cover the increased size second open etch region (e.g. 462) and expose the increased size first and third open etch regions (e.g. 761, 763). The mask material used in the second etch mask can be photoresist material or different types of mask material.

Figure 14:
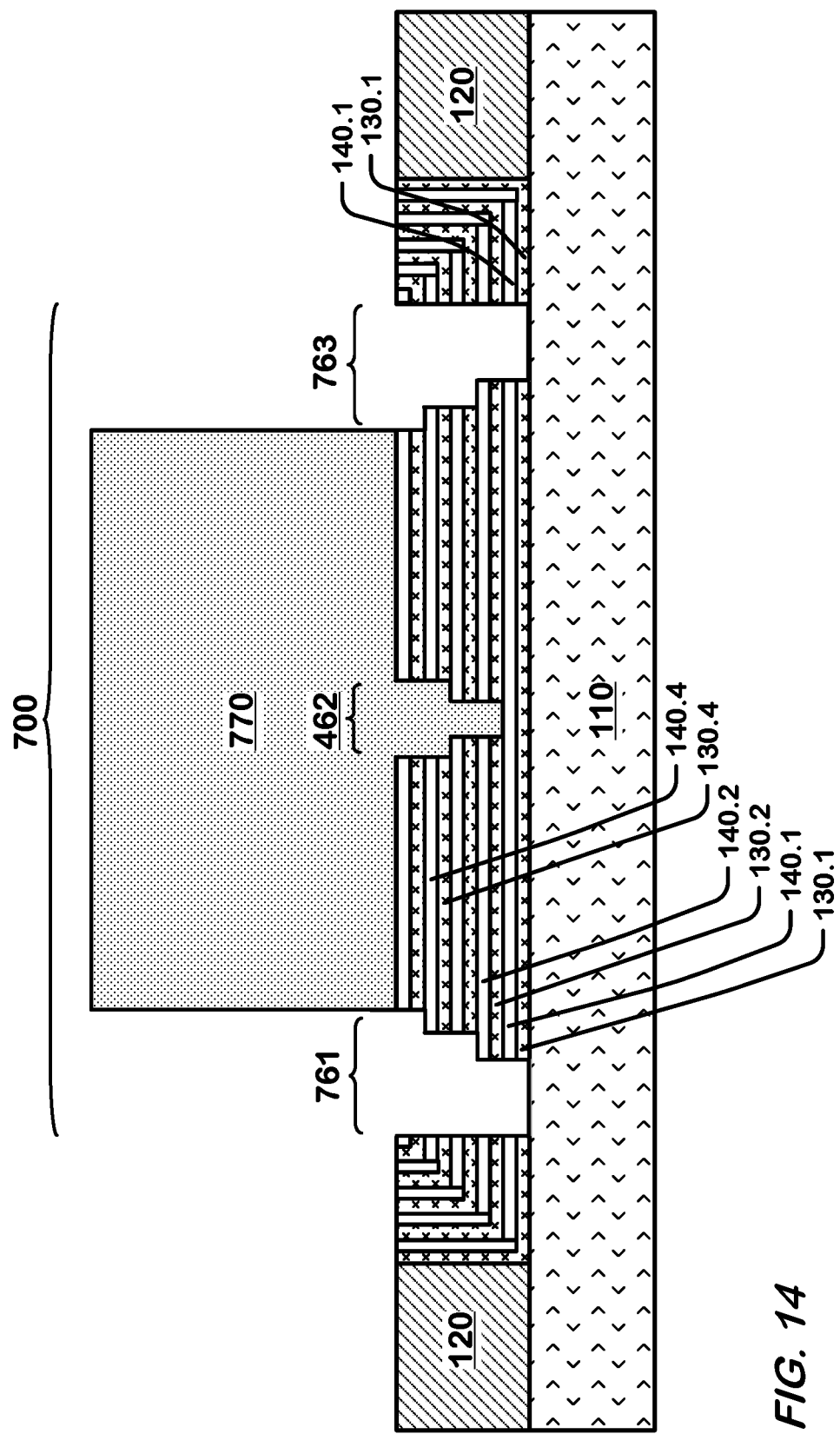

FIG. 14 is a simplified cross-sectional view of the structure, showing the result of etching through one level in the set of N levels using the second etch mask 700, to create landing areas at the second level including a sacrificial layer (e.g. 130.2) and a dielectric layer (e.g. 140.2) and the fourth level including a sacrificial layer (e.g. 130.4) and a dielectric layer (e.g. 140.4) in the first and third open etch regions (e.g. 761 and 763). The one level etched through can include a sacrificial layer (e.g. 130.1) and a dielectric layer (e.g. 140.1).

Figure 15:
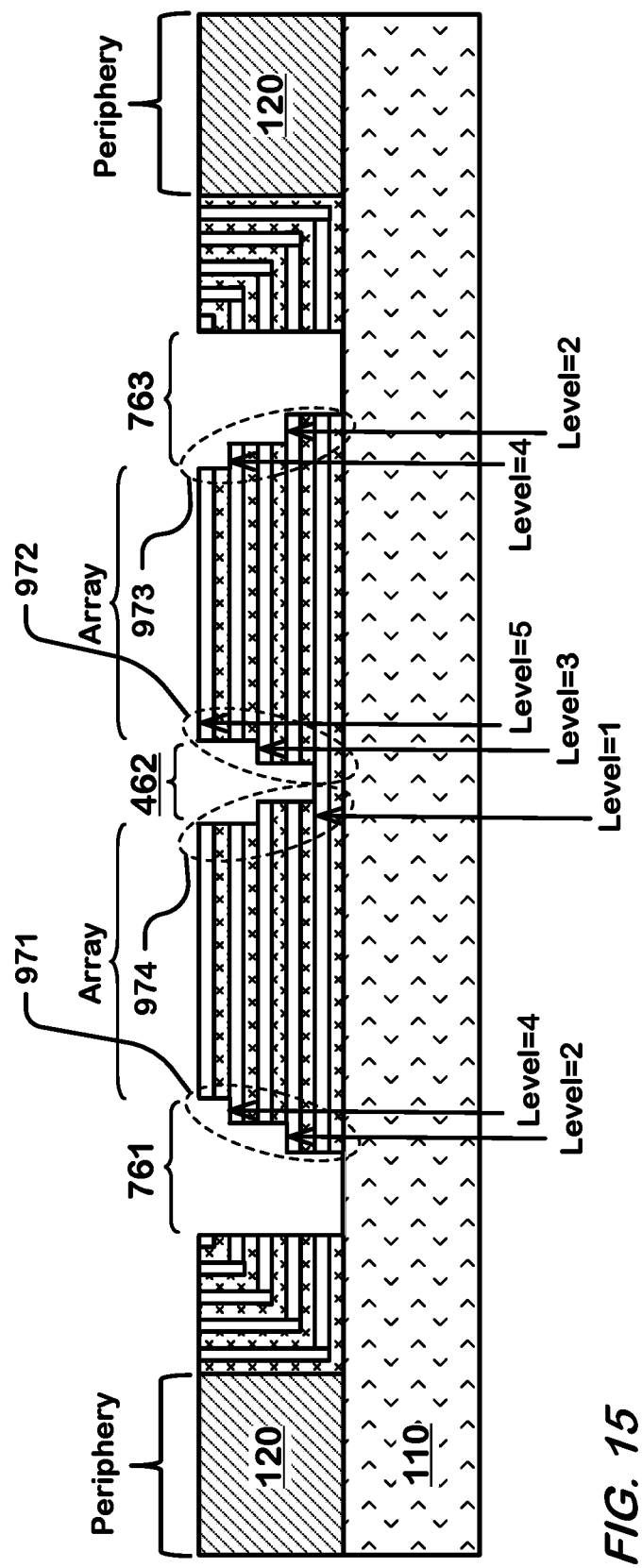

FIG. 15 is a simplified cross-sectional view of the structure, showing the result of removing the second etch mask after etching through one level in the set of N levels using the second etch mask (e.g. 700, FIG. 14). The process steps illustrated in FIGS. 7-15 can result in landing areas formed on N levels (e.g. N=5, Levels=1-5), using a first etch-trim mask to etch through N−1 levels, and a second etch mask to etch through one level in the N levels.

The structure at this process step includes a set of N levels (e.g. N=5), and first, second and third open etch regions (e.g. 761, 462, 763) on the set of N levels overlying first, second and third stairstep structures (e.g. 971, 972, 973), respectively. The second open etch region is disposed between the first and third open etch regions.

In this example, the first stairstep structure in the first open etch region and the third stairstep structure in the third open etch region can include a first stairstep structure configuration, and the second stairstep structure in the second open etch region can include a second stairstep structure configuration different than the first stairstep structure configuration.

In one embodiment, the first stairstep structure configuration includes landing areas on levels L(i×2) for i going from 1 to M1, where M1 is (N−1)/2 when N is odd and M1 is N/2 when N is even, and another landing area on a level L(N) when N is odd. The second stairstep structure configuration includes landing areas on levels L(i×2+1) for i going from 0 to M2, where M2 is (N−1)/2 when N is odd and M2 is N/2−1 when N is even, and another landing area on a level L(N) when N is even. In this example, where for N=5, the first stairstep structure configuration includes landing areas on levels 2 and 4, and the second stairstep structure configuration includes landing areas on levels 1, 3 and 5.

The second open etch region on the set of N levels can overlie a fourth stairstep structure (e.g. 974) opposite and in mirror image of the second stairstep structure.

Figure 16:
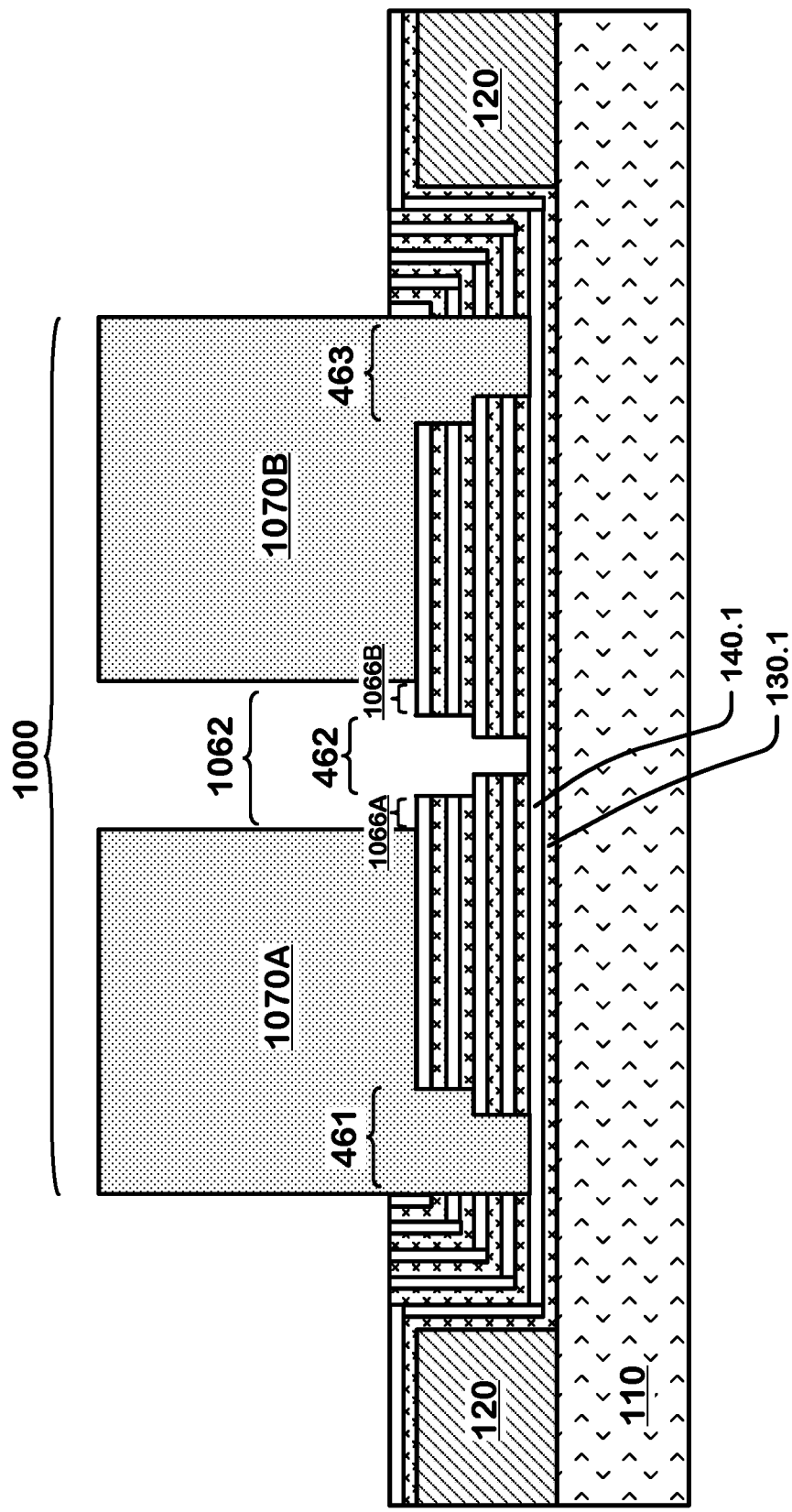
FIGS. 16-18 illustrate one example of process steps that can be alternative steps to the process steps illustrated in FIGS. 13-15.
Figure 17:
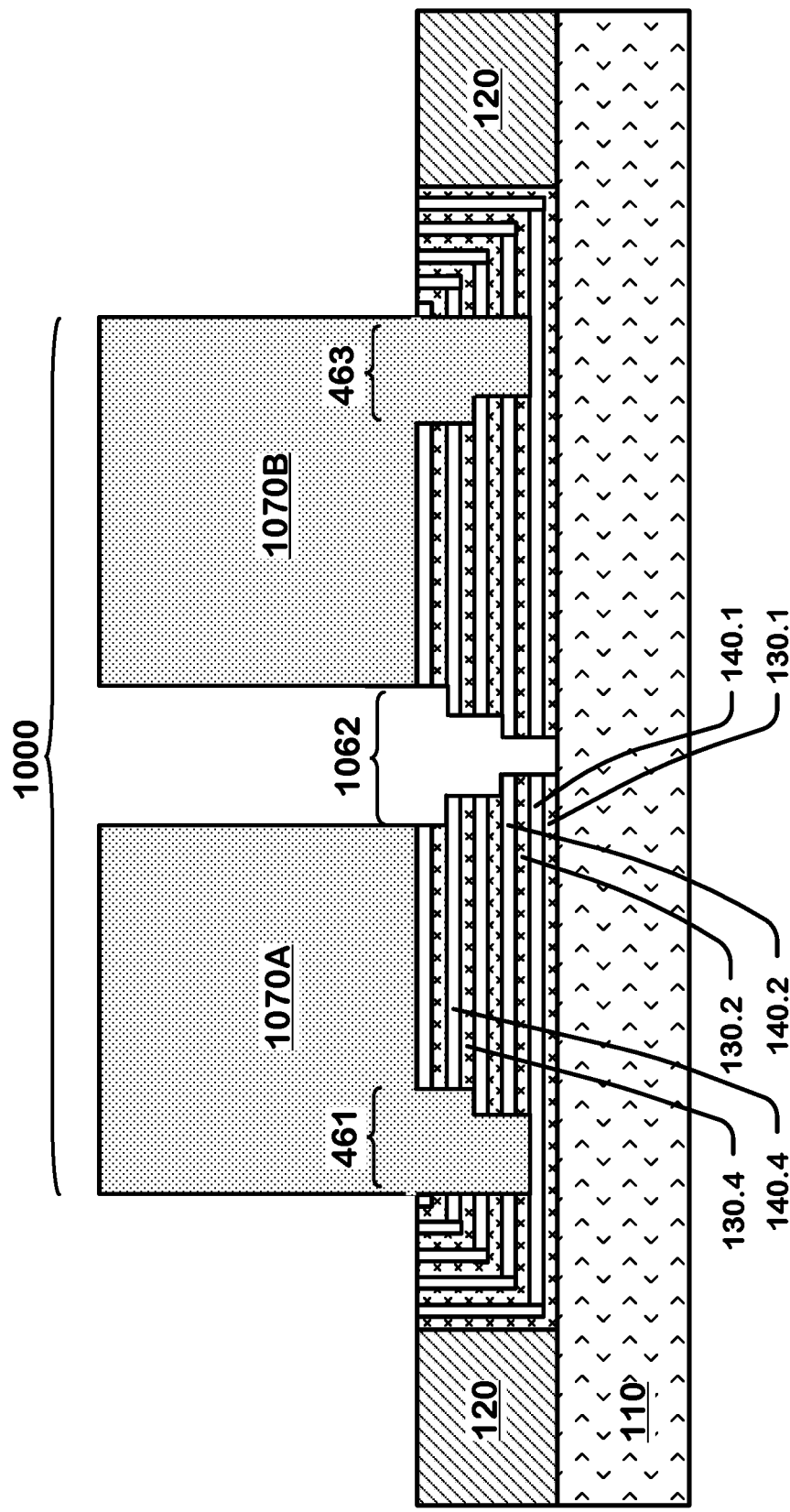
Figure 18:
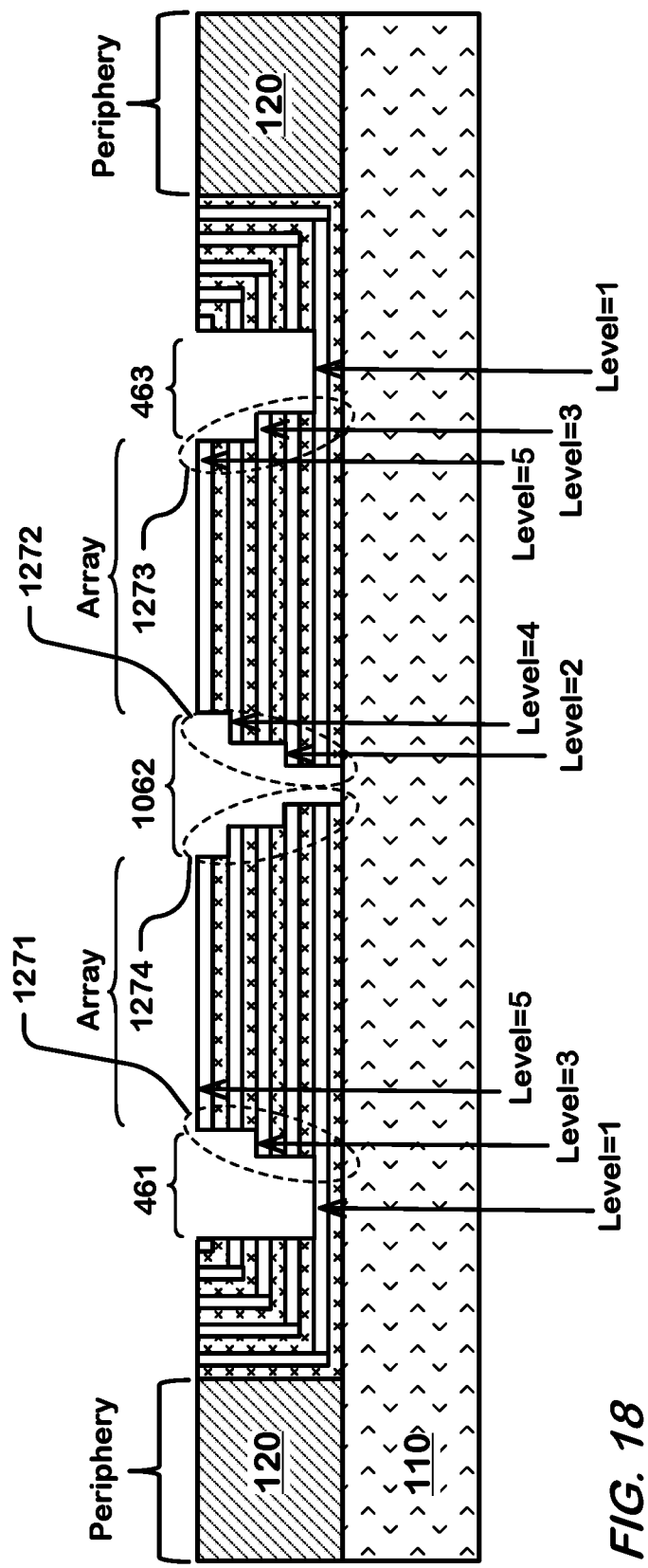

FIGS. 16-18 illustrate one example of process steps that can be alternative steps to the process steps illustrated in FIGS. 13-15.

FIG. 16 is a simplified cross-sectional view of the structure, showing the result of forming an alternative second etch mask 1000 having mask regions (e.g. 1070A, 1070B) over the set of levels as shown in FIG. 12, after the first etch-trim mask is removed. The alternative second etch mask can cover at least one of the increased size first, second and third open etch regions, and expose others of the increased size first, second and third open etch regions. In this example, the alternative second etch mask has new open etch regions 1066A and 1066B disposed opposite each other across region 462, and increased size second open etch region 1062 being equal to region 462 plus regions 1066A and 1066B. The size of the increased size first and third open etch regions (e.g. 461, 463, FIG. 16) remains unchanged from a size of the first and third open etch regions (e.g. 461, 463, FIG. 12) before the alternative second etch mask 1000 is formed.

In the example shown in FIG. 16, the second open etch region (e.g. 1062) can be disposed between the increased size first open etch region (e.g. 461) and the increased size third open etch region (e.g. 463). The alternative second etch mask can cover the increased size first and third open etch regions (e.g. 461, 463) and expose the increased size second open etch region (e.g. 1062). The mask material used in the alternative second etch mask can be photoresist material or different types of mask material.

FIG. 17 is a simplified cross-sectional view of the structure, showing the result of etching one level in the set of N levels using the alternative second etch mask 1000 to create landing areas at the second level including a sacrificial layer (e.g. 130.2) and a dielectric layer (e.g. 140.2) and the fourth level including a sacrificial layer (e.g. 130.4) and a dielectric layer (e.g. 140.4) in the second open etch region 1062. The one level etched through includes a sacrificial layer (e.g. 130.1) and a dielectric layer (e.g. 140.1).

FIG. 18 is a simplified cross-sectional view of the structure, showing the result of removing the alternative second etch mask after etching through one level in the set of N levels using the alternative second etch mask (e.g. 1000, FIG. 17). The process steps illustrated in FIGS. 7-12 and 16-18 can result in landing areas formed on N levels (e.g. N=5, Levels=1-5), using a first etch-trim mask to etch through N−1 levels in the N levels, and using a second etch mask to etch through one level in the N levels.

The structure includes a set of N levels (e.g. N=5), and first, second and third open etch regions (e.g. 461, 1062, 463) on the set of N levels overlying first, second and third stairstep structures (e.g. 1271, 1272, 1273) respectively, the second open etch region being disposed between the first and second open etch regions.

In this example, the first stairstep structure in the first open etch region and the third stairstep structure in the third open etch region can include the second stairstep structure configuration as described herein, where for N=5, landing areas are disposed on levels 1, 3 and 5. The second stairstep structure in the second open etch region can include the first stairstep structure configuration as described herein, where for N=5, landing areas are disposed on levels 2 and 4. The second open etch region on the set of N levels can overlie a fourth stairstep structure (e.g. 1274) opposite and in mirror image of the second stairstep structure.

FIGS. 19-28 illustrate one example of process steps used in forming stairstep structures on a set of N levels, where N is an even integer.

Figure 19:
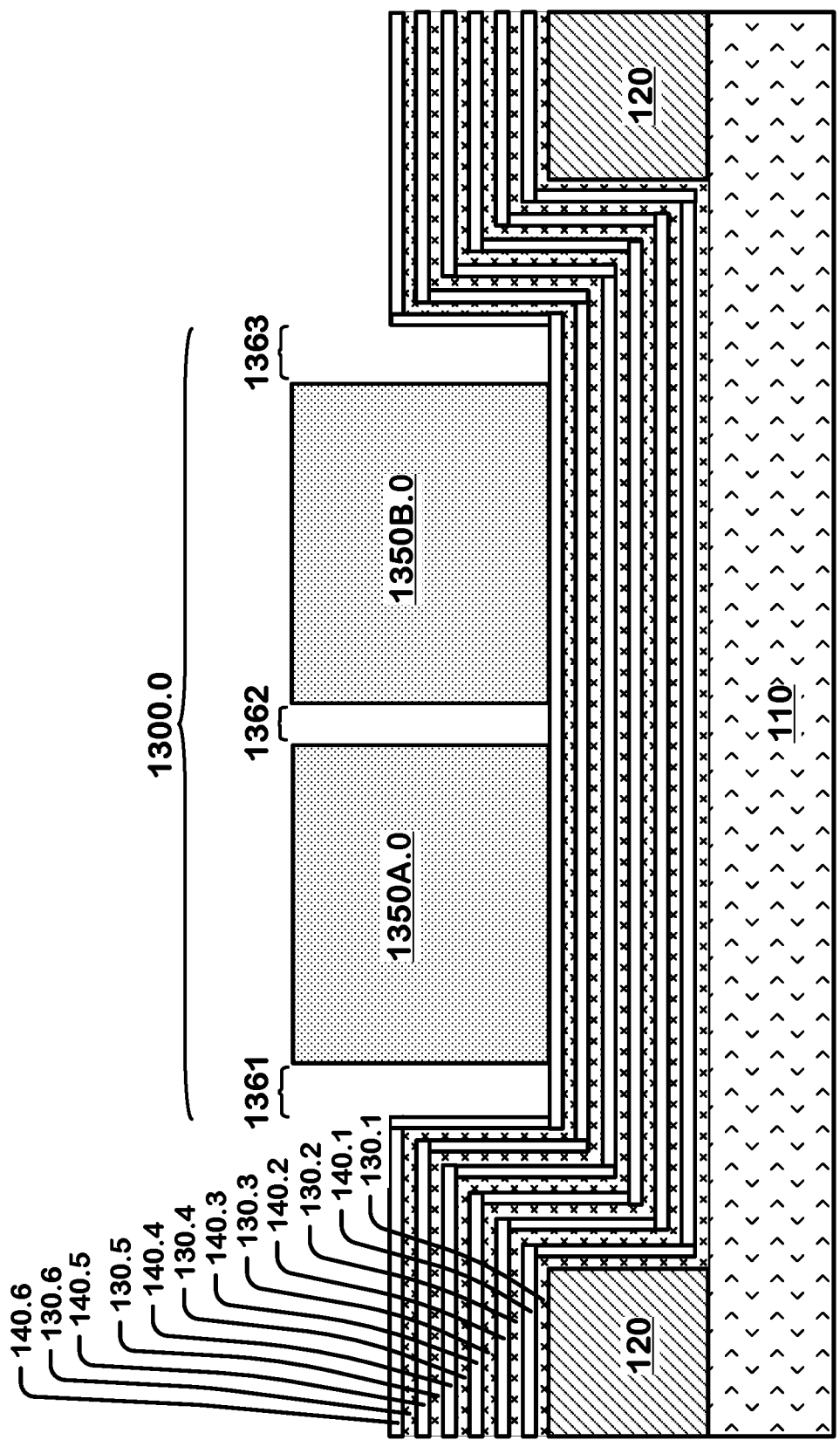
FIGS. 19-28 illustrate one example of process steps used in forming stairstep structures on a set of N levels, where N is an even integer.

FIG. 19 is a simplified cross-sectional view of a portion of an IC device structure, showing the result of forming a first etch-trim mask 1300.0 having mask regions (e.g. 1350A.0, 1350B.0) and spaced apart first, second and third open etch regions (e.g. 1361, 1362, 1363). The first etch-trim mask 1300.0 is disposed over a set of N levels comprising sacrificial layers (e.g. 130.1-130.6) interleaved with dielectric layers (e.g. 140.1-140.6). The mask material used in the first etch-trim mask can be photoresist material or different types of mask material.

Figure 20:
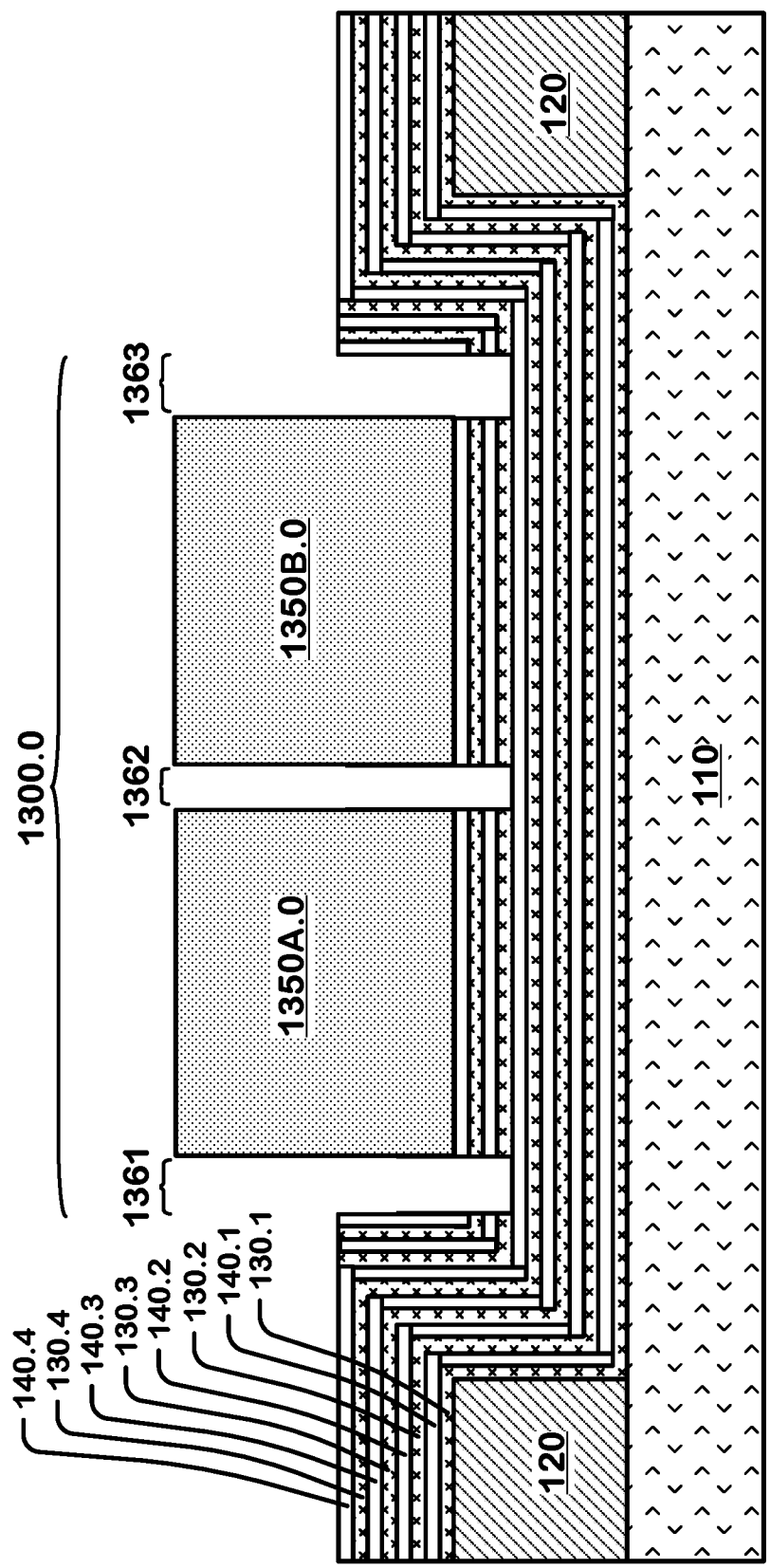

FIG. 20 is a simplified cross-sectional view of the structure, showing the result of etching through two levels in the set of N levels using the first etch-trim mask (e.g. 1300.0), and stopping at fourth dielectric layer 140.4 in a fourth level in the set of N levels. The two levels etched through at this process step include sacrificial layers (e.g. 130.5-130.6) and dielectric layers (e.g. 140.5-140.6). In particular, the two levels in the spaced apart first, second and third open etch regions (e.g. 1361, 1362, 1363, respectively) are etched through.

Two levels in the set can be etched through using the first etch-trim mask in each of M etch-trim cycles, where M is (N−1)/2 when N is odd and M is (N/2)−1 when N is even. In this example, N is 6, so M=(6/2)−1=2, and two levels can be etched through in each of two etch-trim cycles.

Figure 21:
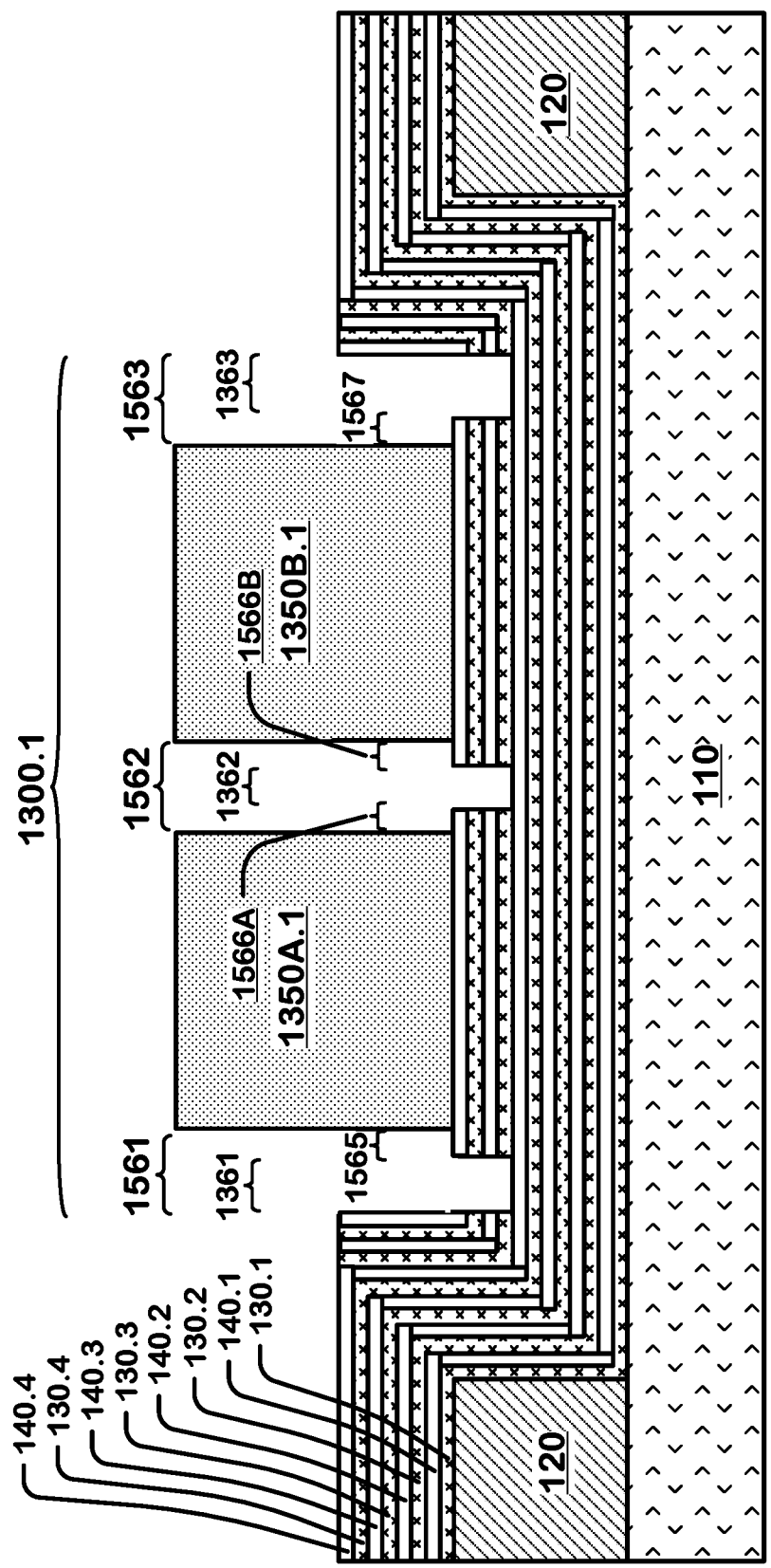

FIG. 21 is a simplified cross-sectional view of the structure, showing the result of trimming the first etch-trim mask (e.g. 1300.0, FIG. 20) to increase the size of the first, second and third open etch regions. The trimming step results in the increased size first, second and third open etch regions (e.g. 1561, 1562, 1563, respectively). In particular, the trimming step creates a trimmed first etch-trim mask 1300.1 having trimmed mask regions (e.g. 1350A.1, 1350B.1), a new open etch region 1565, an increased size first open etch region 1561 being equal to region 1361 plus region 1565, a new open etch region 1567, and an increased size third open etch region 1563 being equal to region 1363 plus region 1567. The trimmed first etch-trim mask (e.g. 1300.1) also has new open etch regions 1566A and 1566B, and an increased size second open etch region 1562 being equal to region 1362 plus regions 1566A and 1566B.

The step to trim the first etch-trim mask can be executed in each of etch-trim cycles C(i) for i going from 1 to T−1, where T is (N−1)/2 when N is odd and T is N/2 when N is even. In this example, N is 6, so T−1=6/2−1=2, and the step to trim the first etch-trim mask can be executed two times.

Figure 22:
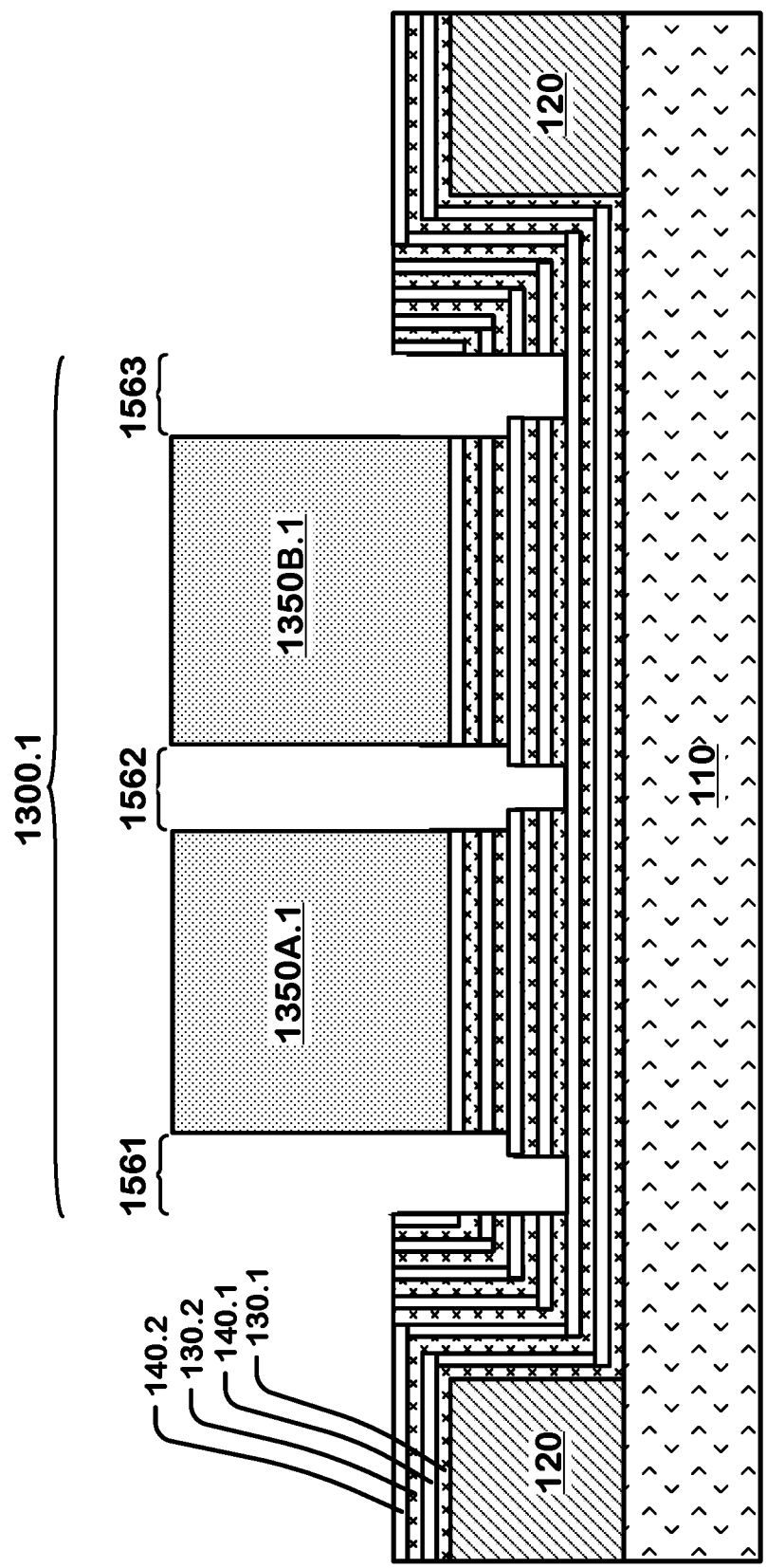

FIG. 22 is a simplified cross-sectional view of the structure, showing the result of etching through two levels in the set of N levels using the trimmed first etch-trim mask (e.g. 1300.1), stopping at second dielectric layer 140.2 in a second level in the set of N levels. The two levels etched through at this process step include sacrificial layers (e.g. 130.3-130.4) interleaved with dielectric layers (e.g. 140.3-140.4). In particular, the two levels in the increased size first, second and third open etch regions (e.g. 1561, 1562, 1563, respectively) are etched through.

As explained above, when N=6, two levels in the set of N levels can be etched through in each of two etch-trim cycles. While FIG. 20 shows the result of etching through two levels in one of the two etch-trim cycles, FIG. 22 shows the result of etching through two levels in another of the two etch-trim cycles.

Figure 23:
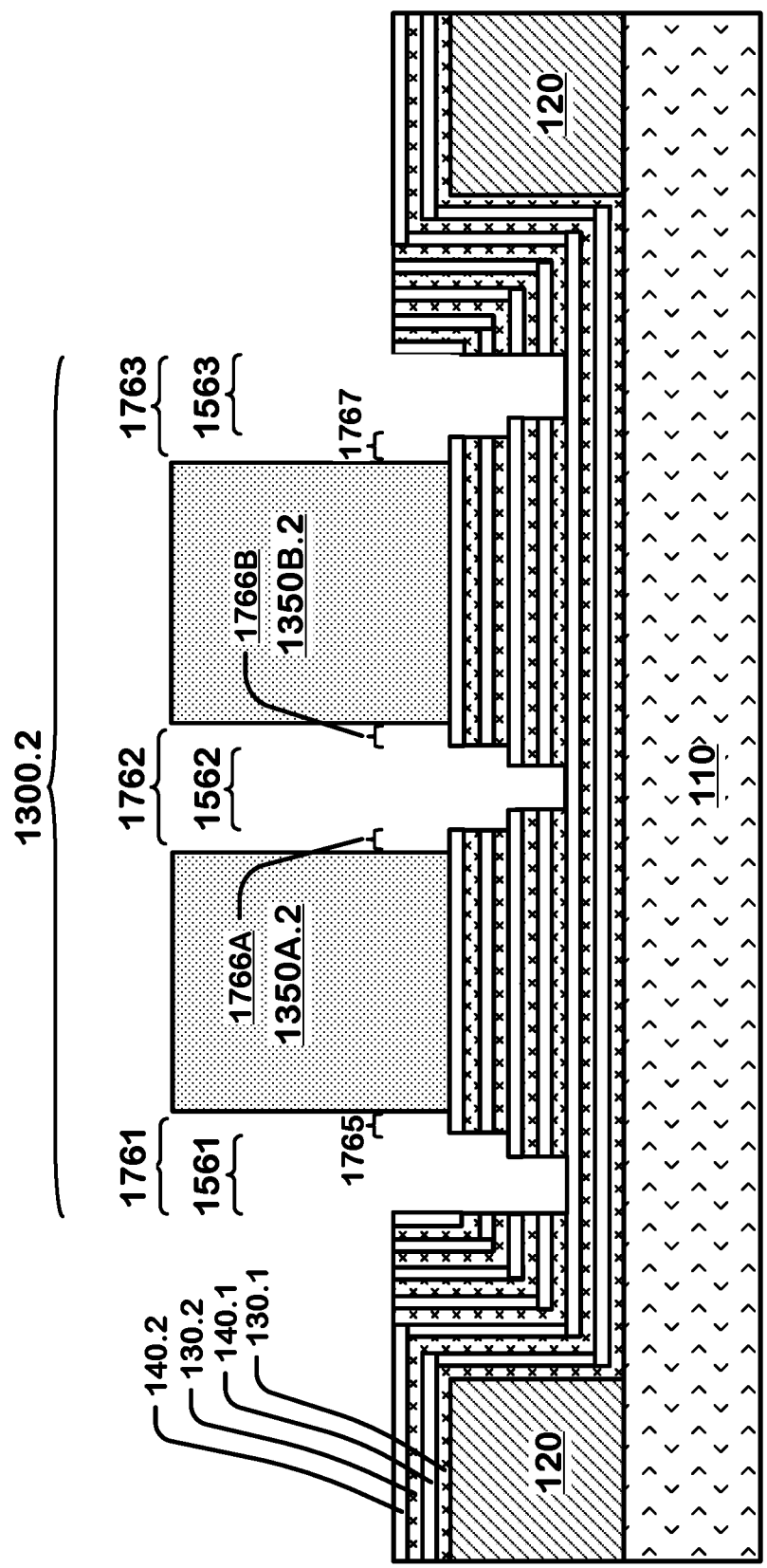

FIG. 23 is a simplified cross-sectional view of the structure, showing the result of trimming the first etch-trim mask (e.g. 1300.1, FIG. 22) for a second time to increase the size of the first, second and third open etch regions. The trimming step results in the increased size first, second and third open etch regions (e.g. 1761, 1762, 1763, respectively). In particular, the trimming step creates a trimmed first etch-trim mask 1300.2 having trimmed mask regions (e.g. 1350A.2, 1350B.2), a new open etch region 1765, an increased size first open etch region 1761 being equal to region 1561 plus region 1765, a new open etch region 1767, and an increased size third open etch region 1763 being equal to region 1563 plus region 1767. The trimmed first etch-trim mask (e.g. 1300.2) also has new open etch regions 1766A and 1766B, and an increased size second open etch region 1762 being equal to region 1562 plus regions 1766A and 1766B.

As explained in reference to FIG. 21, when N=6, the step to trim the first etch-trim mask can be executed two times. While FIG. 21 shows the result of trimming the first etch-trim mask for one of the two times, FIG. 23 shows the result of trimming the first etch-trim mask for another of the two times.

Figure 24:
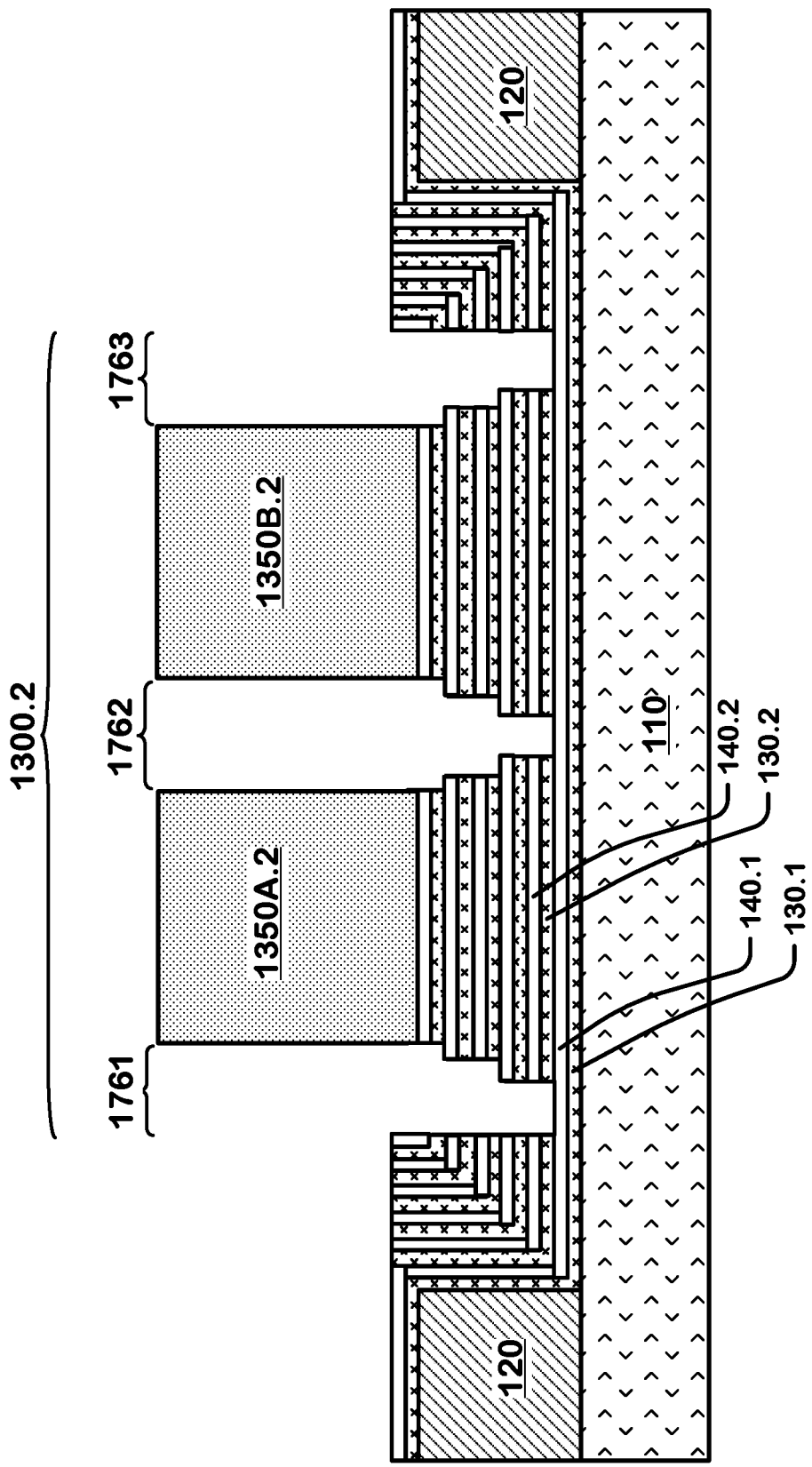

FIG. 24 is a simplified cross-sectional view of the structure, showing the result of etching through one level in the set of N levels using the trimmed first etch-trim mask (e.g. 1300.2) when N is even, stopping at first dielectric layer 140.1 in a first level in the set of N levels. In this example, N=6. The second level etched through includes a sacrificial layer (e.g. 130.2) and a dielectric layer (e.g. 140.2). In particular, the second level in the increased size first, second and third open etch regions (e.g. 1761, 1762, 1763, respectively) is etched through at this process step.

In this example, when N is an even integer, after etching through two levels in the set of N levels using the first etch-trim mask in each of M etch-trim cycles, and etching through one level in the set of N levels using the first etch-trim mask in one etch-trim cycle when N is even, the first etch-trim mask is not trimmed again.

Figure 25:
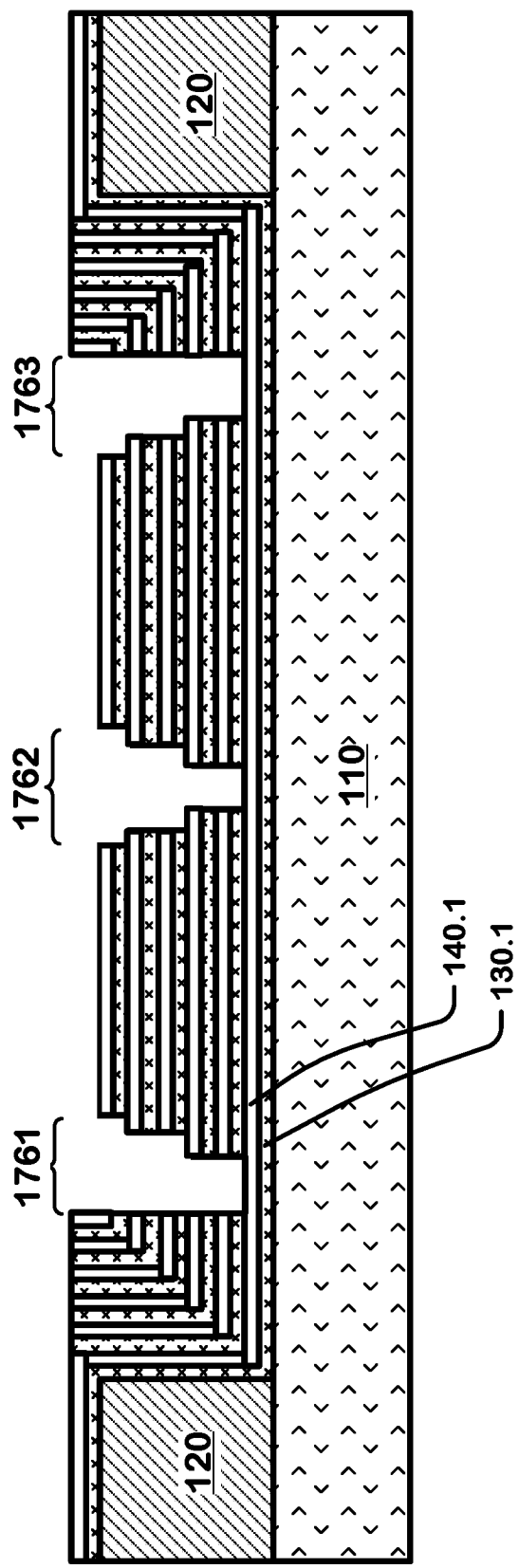

FIG. 25 is a simplified cross-sectional view of the structure, showing the result of removing the trimmed first etch-trim mask (e.g. 1300.2, FIG. 24). At this process step, one level in the set of levels remains to be etched, including a sacrificial layer (e.g. 130.1) and a dielectric layer (e.g. 140.1).

Figure 26:
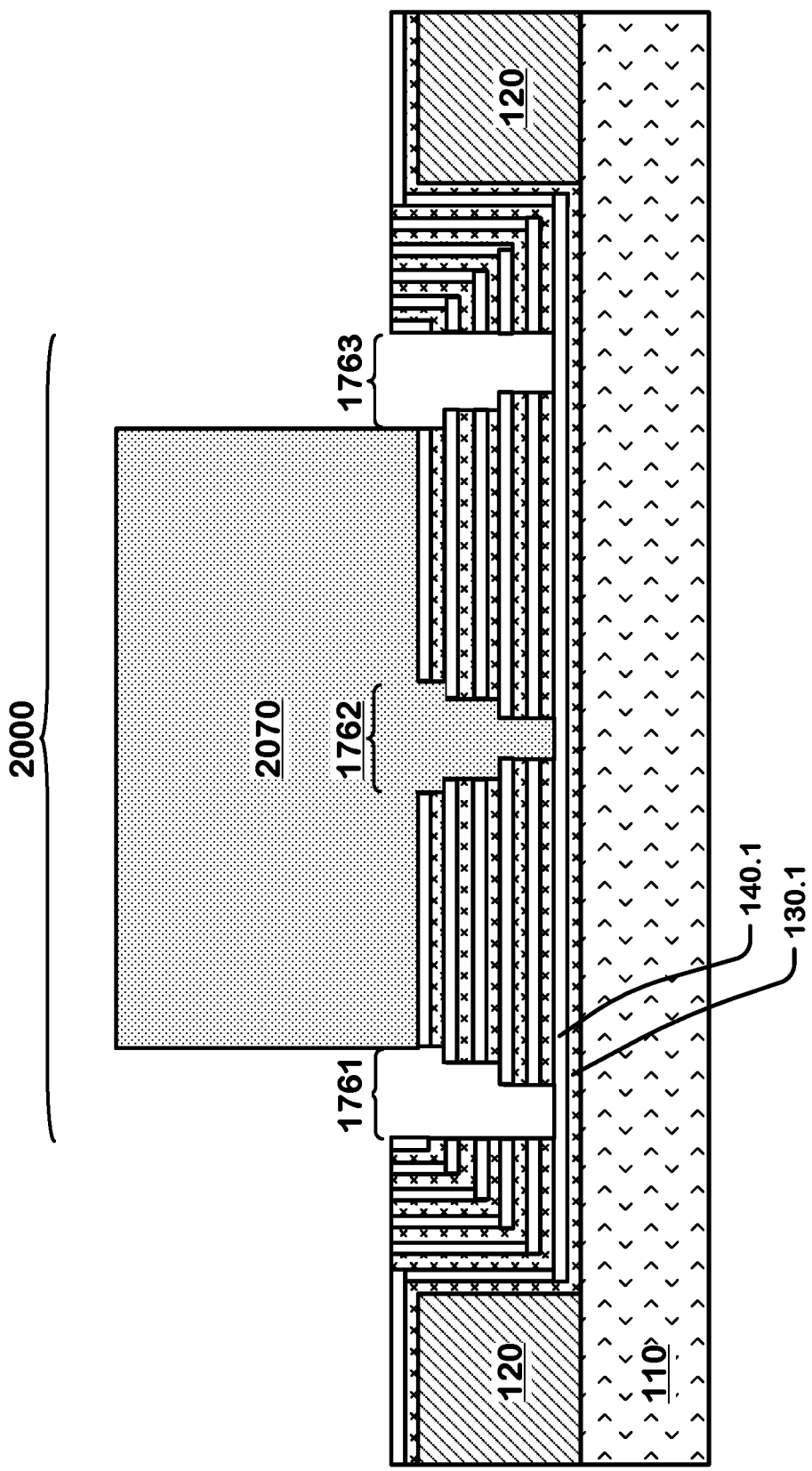

FIG. 26 is a simplified cross-sectional view of the structure, showing the result of forming a second etch mask 2000 having a mask region (e.g. 2070) over the set of N levels, after the trimmed first etch-trim mask (e.g. 1300.2, FIG. 24) is removed as shown in FIG. 25. The second etch mask can cover at least one of the increased size first, second and third open etch regions, and expose others of the increased size first, second and third open etch regions. The size of the increased first, second and third open etch regions (e.g. 1761, 1762, 1763, FIG. 26) remains unchanged from the size of the increased size first, second and third open etch regions (e.g. 1761, 1762, 1763, FIG. 25) before the second etch mask is formed.

In the example shown in FIG. 26, the second open etch region (e.g. 1762) can be disposed between the increased size first open etch region (e.g. 1761) and the increased size third open etch region (e.g. 1763). The second etch mask can cover the increased size second open etch region (e.g. 1762) and expose the increased size first and third open etch regions (e.g. 1761, 1763). The mask material used in the second etch mask can be photoresist material or different types of mask material.

Figure 27:
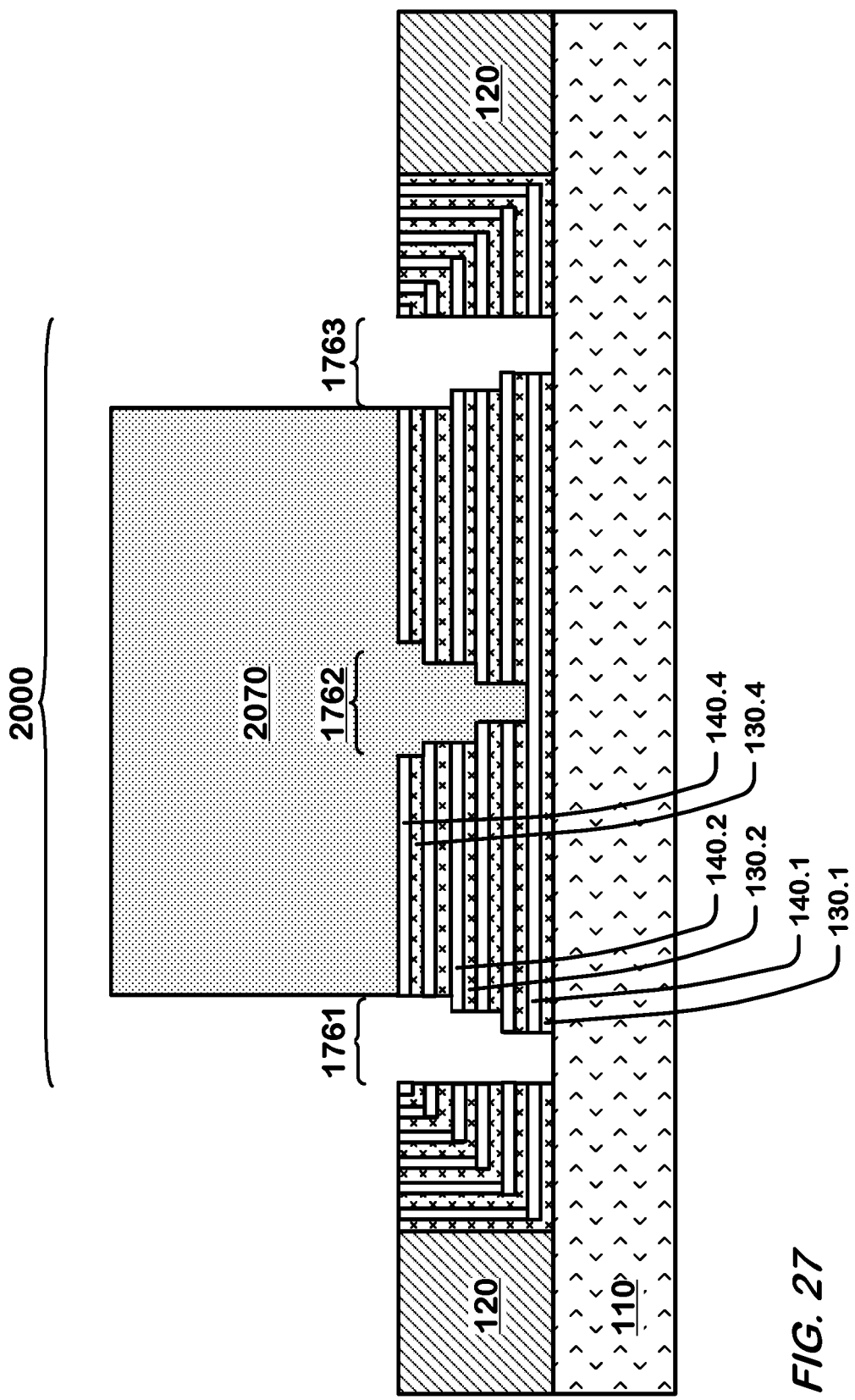

FIG. 27 is a simplified cross-sectional view of the structure, showing the result of etching one level in the set of N levels using the second etch mask 2000, to create landing areas at the second level including a sacrificial layer (e.g. 130.2) and a dielectric layer (e.g. 140.2) and the fourth level including a sacrificial layer (e.g. 130.4) and a dielectric layer (e.g. 140.4) in the first and third open etch regions (e.g. 1761 and 1763). The one level etched through can include a sacrificial layer (e.g. 130.1) and a dielectric layer (e.g. 140.1).

Figure 28:
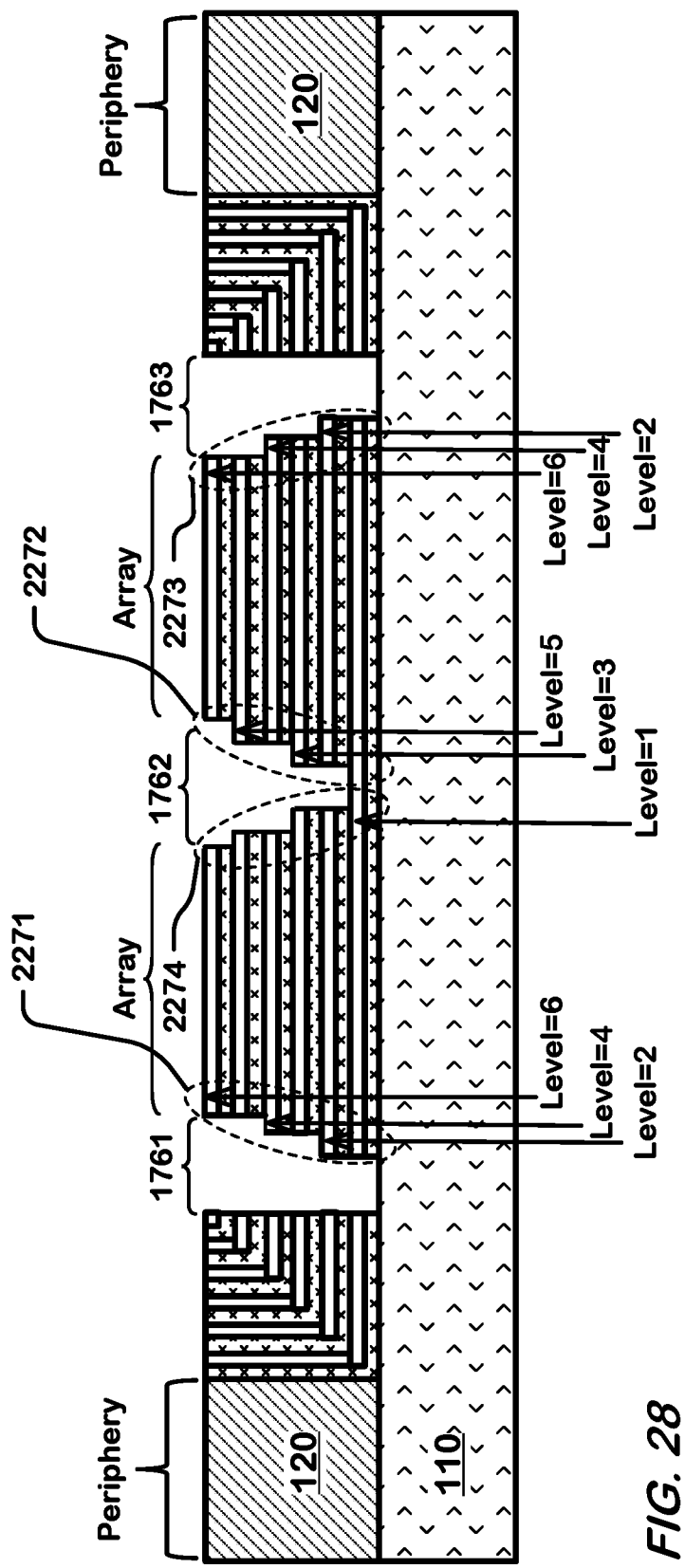

FIG. 28 is a simplified cross-sectional view of the structure, showing the result of removing the second etch mask (e.g. 2000, FIG. 27) after etching through one level in the set of N levels using the second etch mask. The process steps illustrated in FIGS. 19-28 can result in landing areas formed on N levels (e.g. N=6, Levels=1-6), using a first etch-trim mask to etch through N−1 levels, and a second etch mask to etch through one level in the N levels.

The structure includes a set of N levels (e.g. N=6), and first, second and third open etch regions (e.g. 1761, 1762, 1763) on the set of N levels overlying first, second and third stairstep structures (e.g. 2271, 2272, 2273) respectively. The second open etch region is disposed between the first and third open etch regions.

In this example, the first stairstep structure in the first open etch region and the third stairstep structure in the third open etch region can include the first stairstep structure configuration as described herein, where for N=6, landing areas are disposed on levels 2, 4 and 6. The second stairstep structure in the second open etch region can include the second stairstep structure configuration as described herein, where for N=6, landing areas are disposed on levels 1, 3 and 5. The second open etch region on the set of N levels can overlie a fourth stairstep structure (e.g. 2274) opposite and in mirror image of the second stairstep structure.

Figure 29:
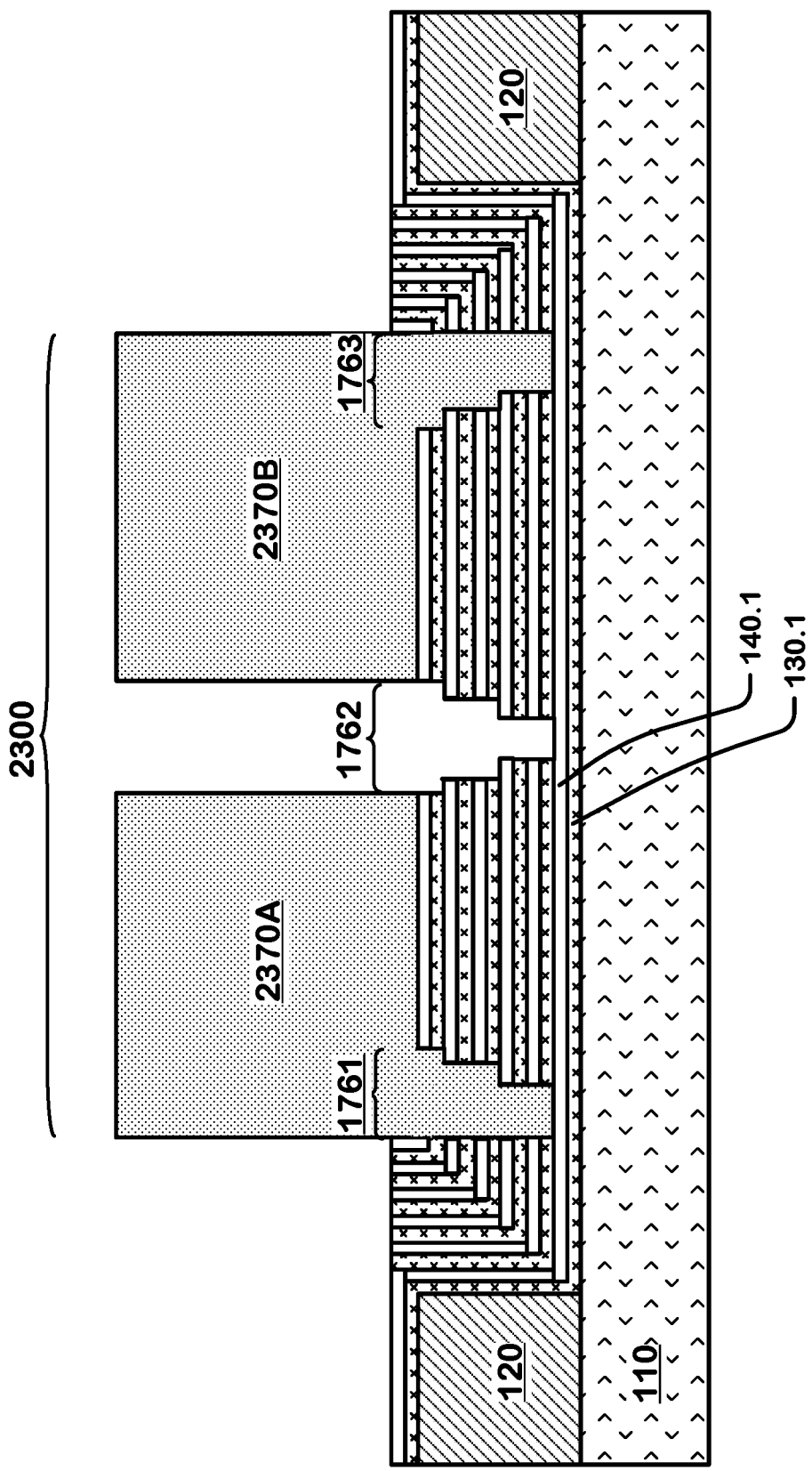
FIGS. 29-31 illustrate one example of process steps that can be alternative steps to the process steps illustrated in FIGS. 26-28.
Figure 30:
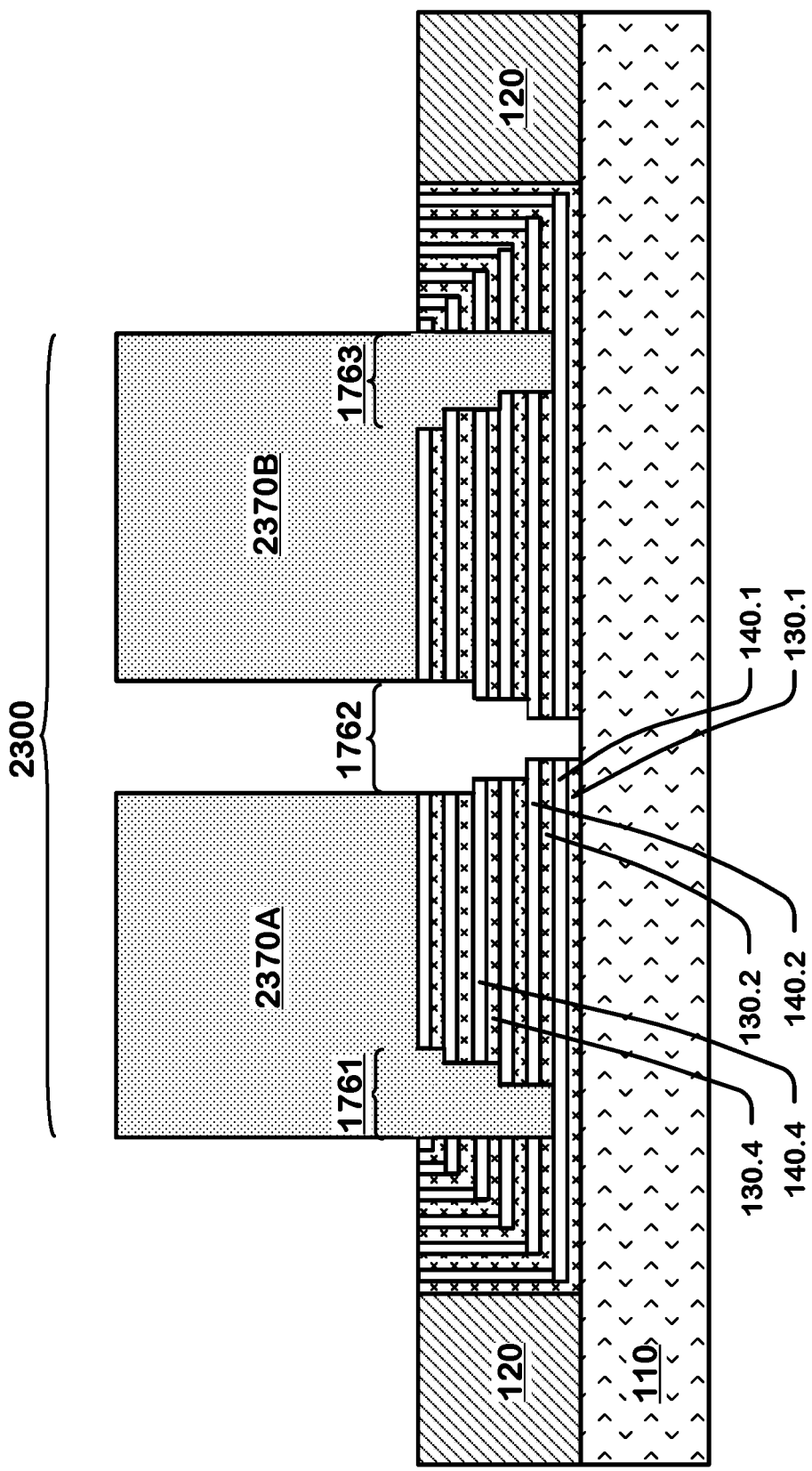
Figure 31:
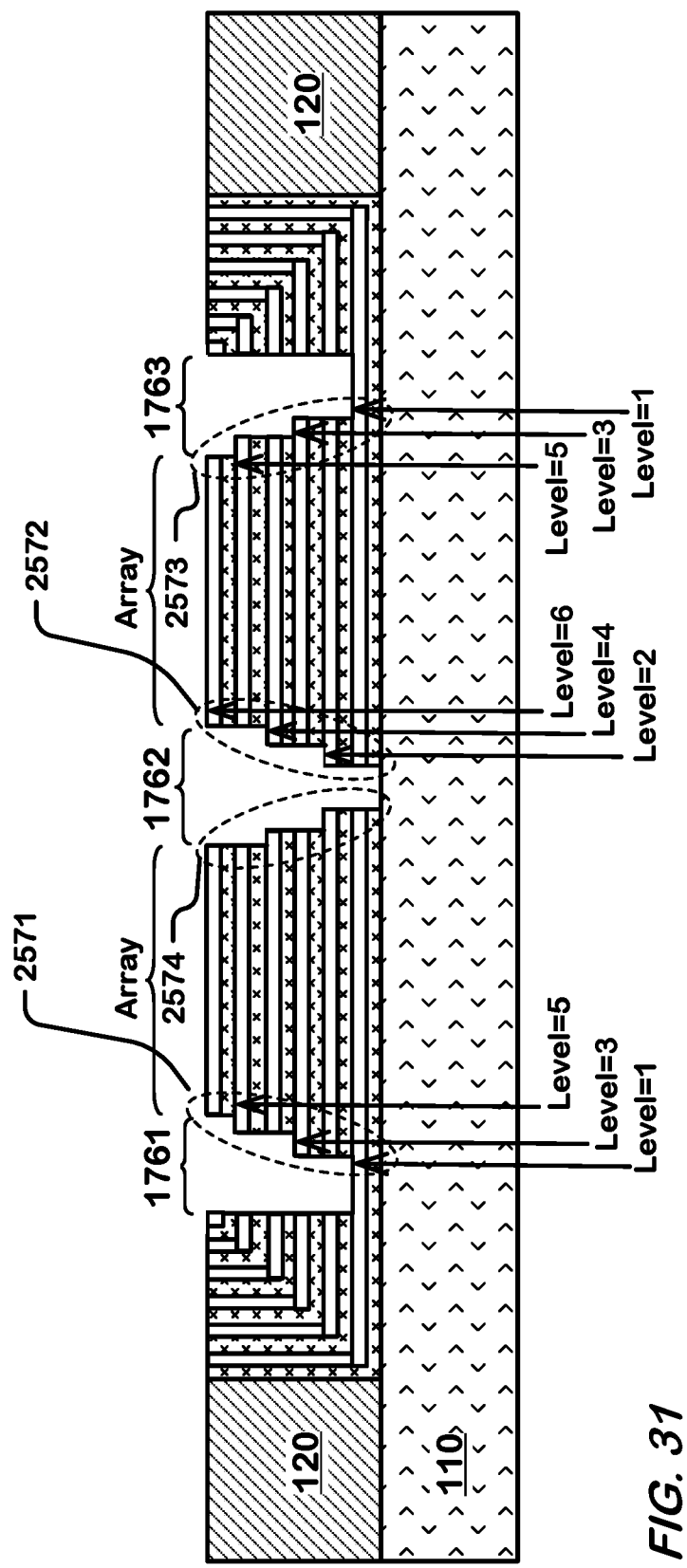

FIGS. 29-31 illustrate one example of process steps that can be alternative steps to the process steps illustrated in FIGS. 26-28.

FIG. 29 is a simplified cross-sectional view of the structure, showing the result of forming an alternative second etch mask 2300 having mask regions (e.g. 2370A, 2370B) over the set of N levels after the trimmed first etch-trim mask 1300.2 having trimmed mask regions (e.g. 1350A.2, 1350B.2, FIG. 24) is removed. The alternative second etch mask can cover at least one of the increased size first, second and third open etch regions, and expose others of the increased size first, second and third open etch regions. The size of the increased size first, second and third open etch regions (e.g. 1761, 1762, 1763, FIG. 29) remains unchanged from the size of the increased size first, second and third open etch regions (e.g. 1761, 1762, 1763, FIG. 25) before the alternative second etch mask 2300 is formed.

In the example shown in FIG. 29, the second open etch region (e.g. 1762) can be disposed between the increased size first open etch region (e.g. 1761) and the increased size third open etch region (e.g. 1763). The alternative second etch mask can cover the increased size first and third open etch regions (e.g. 1761, 1763) and expose the increased size second open etch region (e.g. 1762). The mask material used in the alternative second etch mask can be photoresist material or different types of mask material.

FIG. 30 is a simplified cross-sectional view of the structure, showing the result of etching one level in the set of N levels using the alternative second etch mask 2300, to create landing areas at the second level including a sacrificial layer (e.g. 130.2) and a dielectric layer (e.g. 140.2) and the fourth level including a sacrificial layer (e.g. 130.4) and a dielectric layer (e.g. 140.4) in the second open etch region 1762. The one level etched through includes a sacrificial layer (e.g. 130.1) and a dielectric layer (e.g. 140.1).

FIG. 31 is a simplified cross-sectional view of the structure, showing the result of removing the alternative second etch mask after etching through one level in the set of N levels using the alternative second etch mask (e.g. 2300, FIG. 30). The process steps illustrated in FIGS. 19-25 and 29-31 can result in landing areas formed on N levels (e.g. N=6, Levels=1-6), using a first etch-trim mask to etch through N−1 levels in the N levels, and using a second etch mask to etch through one level in the N levels.

The structure includes a set of N levels (e.g. N=6), and first, second and third open etch regions (e.g. 1761, 1762, 1763) on the set of N levels overlying first, second and third stairstep structures (e.g. 2571, 2572, 2573) respectively. The second open etch region is disposed between the first and third open etch regions.

In this example, the first stairstep structure in the first open etch region and the third stairstep structure in the third open etch region can include the second stairstep structure configuration as described herein, where for N=6, landing areas are disposed on levels 1, 3 and 5. The second stairstep structure in the second open etch region can include the first stairstep structure configuration as described herein, where for N=6, landing areas are disposed on levels 2, 4 and 6. The second open etch region on the set of N levels can overlie a fourth stairstep structure (e.g. 2574) opposite and in mirror image of the second stairstep structure.

Figure 32:
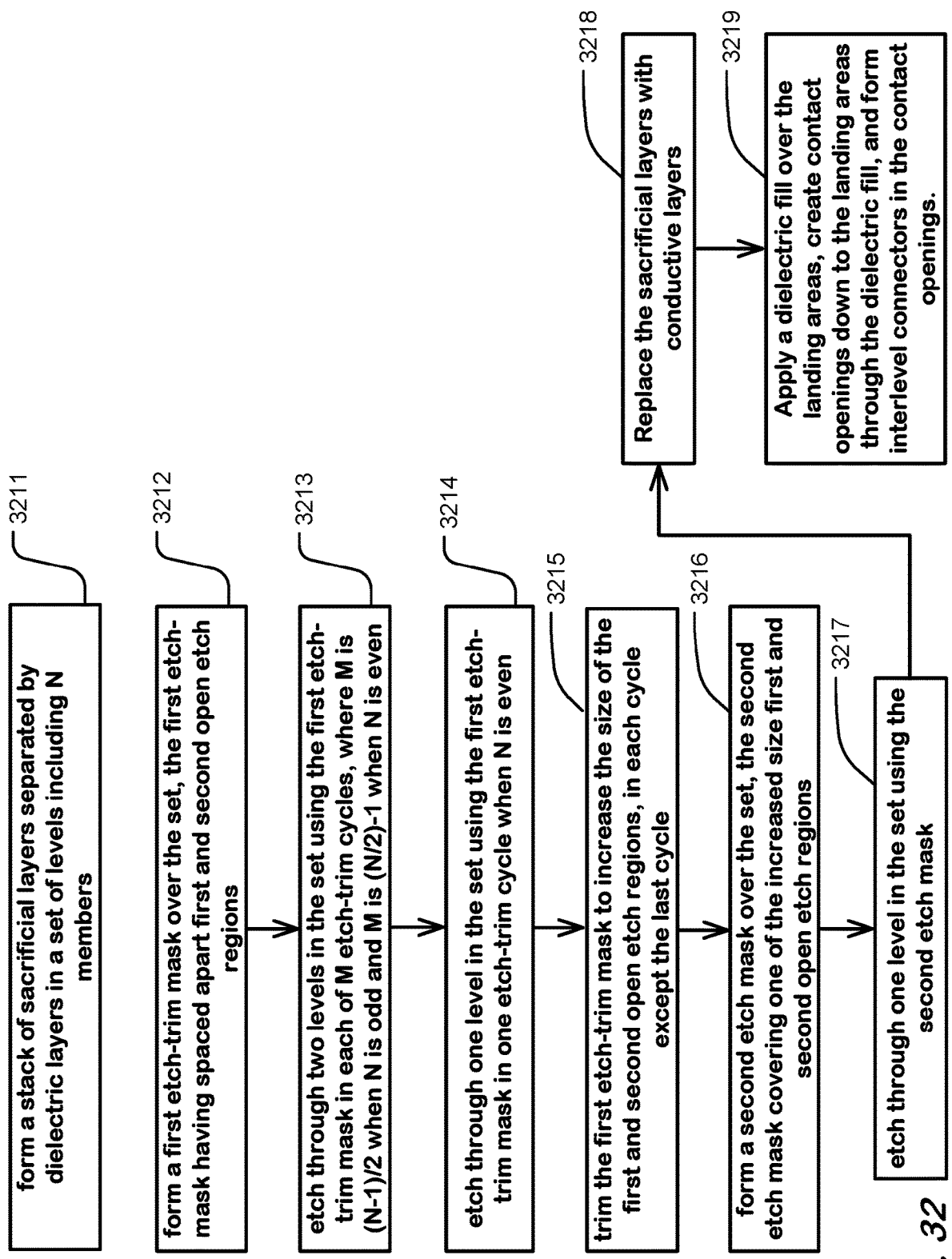
FIG. 32 illustrates a simplified flowchart of process steps used in forming stairstep structures on a set of N levels.

FIG. 32 illustrates a simplified flowchart of process steps used in forming stairstep structures on a set of N levels, where N is an integer greater than 2.

Portions of the circuit layers in the set are removed to form landing areas on the circuit layers in the set using a first etch-trim mask and a second etch mask, as illustrated in the following process steps.

At Step 3211, a stack of sacrificial layers separated by dielectric layers in a set of levels including N members can be formed. For example, a sacrificial layer can include a sacrificial material such as SiN or SiO. At a later stage of the process (e.g. Step 3218), the sacrificial layers can be replaced with conductive layers.

At Step 3212, the first etch-trim mask can be formed over the set of N levels, where the first etch-trim mask has spaced apart first and second open etch regions.

At Step 3213, two levels in the set can be etched through using the first etch-trim mask in each of M etch-trim cycles, where M is (N−1)/2 when N is odd and M is (N/2)−1 when N is even. At Step 3214, One level in the set can be etched through using the first etch-trim mask in one etch-trim cycle when N is even. In one embodiment, Step 3213 can be executed before Step 3214. In an alternative embodiment, Step 3214 can be executed before Step 3213.

At Step 3215, the first etch-trim mask can be trimmed to increase the size of the first and second open etch regions, in each of etch-trim cycles C(i) for i going from 1 to T−1, where T is (N−1)/2 when N is odd and T is N/2 when N is even. Here the "etch-trim cycles C(i) for i going from 1 to T−1" include the "M etch-trim cycles" (Step 3213) and the "one etch-trim cycle" when N is even (Step 3214), except the last cycle in a sequence of etch-trim cycles including the "M etch-trim cycles" and the "one etch-trim cycle". In such a sequence of etch-trim cycles, the "M etch-trim cycles" can be executed before the "one etch-trim cycle", or vice versa.

In one embodiment, in a sequence of etch-trim cycles where the "M etch-trim cycles" are executed before the "one etch-trim cycle," the last cycle is the "one etch-trim cycle" in which the first etch-trim mask is not trimmed. In an alternative embodiment, in a sequence of etch-trim cycles where the "one etch-trim cycle" is executed before the "M etch-trim cycles", the last cycle in the sequence is the last cycle of the "M etch-trim cycles" in which the first etch-trim mask is not trimmed.

At Step 3216, a second etch mask can be formed over the set, where the second etch mask can cover one of the increased size first and second open etch regions, and expose another of the increased size first and second open etch regions. At Step 3217, one level in the set can then be etched through using the second etch mask.

In one embodiment, Steps 3212-3215 can be executed before Steps 3215-3216, and the first etch-trim mask is removed before forming the second etch mask. In an alternative embodiment, Steps 3215-3216 can be executed before Steps 3212-3215, and the second etch mask is removed before forming the first etch-trim mask.

At Step 3218, the sacrificial layers in the set of levels can be replaced with conductive layers, to form circuit elements on the set of circuit levels. Each level in the set of circuit levels can include a layer of conductive material and a layer of insulating material. The circuit elements on the levels can be conductors connected to word lines, bit lines or other circuit elements in a multilevel circuitry.

At Step 3219, after landing areas are formed on the levels in the set of levels, a dielectric fill can be applied over the landing areas. Contact openings can be created down to the landing areas through the dielectric fill, and interlevel connectors can be formed in the contact openings.

While the present technology is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the technology and the scope of the following claims.

What is claimed is:

1. A device comprising:
    multilevel circuitry including a first array and a second array, having circuit elements disposed in a set of circuit levels having N members, where N is an integer greater than 2 that is one of even and odd;
    first and second openings on the set overlying first and second stairstep structures respectively;
    one of the first and second stairstep structures including a first stairstep structure configuration and another of the first and second stairstep structures including a second stairstep structure configuration different than the first stairstep structure configuration, wherein:

the first stairstep structure configuration including landing areas on levels L(i×2) for i going from 1 to M1, where M1 is (N−1)/2 when N is odd and M1 is N/2 when N is even, and another landing area on a level L(N) when N is odd; and the second stairstep structure configuration including landing areas on levels L(i×2+1) for i going from 0 to M2, where M2 is (N−1)/2 when N is odd and M2 is N/2−1 when N is even, and another landing area on a level L(N) when N is even; and the first and second arrays each including the first and second stairstep structure configurations, the first and second arrays including a bottom circuit level in the set of circuit levels continuous from the first array to the second array, the second opening separating the first array from the second array stopping on the bottom circuit level.

2. The device of claim 1, comprising a third opening on the set overlying a third stairstep structure, the second opening being disposed between the first and third openings, the first and third stairstep structures including the first stairstep structure configuration, and the second stairstep structure including the second stairstep structure configuration.

3. The device of claim 1, the second opening on the set overlying a fourth stairstep structure opposite and in mirror image of the second stairstep structure.

4. The device of claim 1, wherein the circuit elements disposed in the set of circuit levels comprise conductors in a layer of conductive material, the device further comprising:

a dielectric fill over the landing areas in the first and second stairstep structure configurations;

contact openings down to the landing areas in the first and second stairstep structure configurations through the dielectric fill; and interlevel connectors in the contact openings contacting the conductors in the layer of conductive material in the landing areas in the first and second stairstep structure configurations.

5. The device of claim 1, wherein the set of circuit levels is disposed in a recess on a substrate.

* * * * *